(12) United States Patent
Jiang et al.

(10) Patent No.: US 12,425,048 B1
(45) Date of Patent: Sep. 23, 2025

(54) TRANSMITTER DRIVER CIRCUIT

(71) Applicant: Synopsys, Inc., Mountain View, CA (US)

(72) Inventors: Qing Jiang, Mississauga (CA); Adam Ross Burns, Burlington (CA); Karanbir Singh Chahal, Brampton (CA); Yunus Ibrahim Dawji, North York (CA)

(73) Assignee: Synopsys, Inc., Sunnyvale, CA (US)

( * ) Notice: Subject to any disclaimer, the term of this patent is extended or adjusted under 35 U.S.C. 154(b) by 225 days.

(21) Appl. No.: 18/317,838

(22) Filed: May 15, 2023

(51) Int. Cl.
  *H03M 9/00* (2006.01)
  *H03K 17/687* (2006.01)
  *H03K 17/76* (2006.01)
  *H03K 19/0185* (2006.01)

(52) U.S. Cl.
  CPC .......... *H03M 9/00* (2013.01); *H03K 17/6872* (2013.01); *H03K 17/76* (2013.01); *H03K 19/018514* (2013.01)

(58) Field of Classification Search
  CPC ..... H03M 9/00; H03K 17/6872; H03K 17/76; H03K 19/018514
  See application file for complete search history.

(56) References Cited

U.S. PATENT DOCUMENTS 8,198,912 B1 * 6/2012 Thinakaran .... H03K 19/018592
   326/30
9,455,713 B1 * 9/2016 Kadkol .......... H03K 19/018514

\* cited by examiner

*Primary Examiner* — Joseph J Lauture
(74) *Attorney, Agent, or Firm* — Fenwick & West LLP

(57) ABSTRACT

A level-shiftless transmitter includes a transmitter driver circuit. The transmitter driver circuit includes a first PMOS device, a second PMOS device, a first NMOS device, a second NMOS device, and a sub-circuit. The sources of the first and second PMOS devices are electrically coupled with each other. The gates of the first PMOS and the first NMOS devices are electrically coupled with each other. The gates of the second PMOS and the second NMOS devices are electrically coupled with each other. The sub-circuit is electrically coupled with a voltage domain to provide a voltage lower than the voltage domain to the sources of the first and second PMOS devices.

20 Claims, 23 Drawing Sheets

| TX Parameter | Specification | | SST TX Driver 200 | | Shiftless SST TX Driver | |
|---|---|---|---|---|---|---|
| corner | Min | Max | typical | worst (ss/125degC) | typical | worst (ss/125degC) |
| Input Data Buffer Current (mA) | | | 7.8 | | 6.41 | |
| Pre-driver Current (mA) | | | 29.6 | | 10.2 | |
| Clocks Buffer Current (mA) | | | 20.8 | | 15.9 | |
| Gain Loss for 1UI Impulse | | | -3.07 | | -0.59 | |
| SNDR (dB) | 31.5 | | 36.6 | 35.1 | 35.5 | 37.3 |
| random jitter (rj) (fs) | | | 24.9 | 58.9 | 18.2 | 26.6 |
| dj (fs) | | | 243 | 501 | 258 | 398 |
| EOJ (fs) | | | 301 | 292 | 250 | 256 |

FIG. 14

TRANSMITTER DRIVER CIRCUIT

TECHNICAL FIELD

The present disclosure generally relates to an electronic circuit. Specifically, the present disclosure relates to a transmitter driver circuit.

BACKGROUND

A high speed and high swing serializer/deserializer (SERDES) transmitter is an electronic device used in a data communication system to transmit digital data. It is used to convert parallel data into serial data for transmission over one or more channels.

A SERDES transmission system includes a transmitter and a receiver connected by a serial link that can operate at high data rates. The transmitter takes in parallel data and converts it into serial data, driving the data signal to transmit through the transmission line, and use clocks signal to synchronize the data transmission. On the other side, the receiver receives the serial data transmitted from the transmitter and converts the received serial data back into parallel data.

An existing high speed SERDES transmitter is often current consuming, and it requires a driver circuit and level shifters to have high bandwidth and high launch amplitude.

SUMMARY

Embodiments described herein include a transmitter driver circuit. The transmitter driver circuit includes a first p-channel metal oxide semiconductor (PMOS) device, a second PMOS device, a first n-channel metal oxide semiconductor (NMOS) device, a second NMOS device and a sub-circuit. Each PMOS or NMOS device has a gate, a source, and a drain. The source of the second PMOS device is electrically couped with the source of the first PMOS device. The gate of the first PMOS device is electrically coupled with the gate of the first NMOS device, and the gate of the second PMOS device is electrically coupled with the gate of the second NMOS device. The sub-circuit electrically coupled with a voltage domain and the sources of the first and second PMOS devices to provide a voltage lower than the voltage domain to the sources of the first and second PMOS devices.

In some embodiments, the transmitter driver circuit further includes a first resistor, a second resistor, a first differential output pad, and a second differential output pad. The first resistor is electrically coupled with the drain of the first PMOS device and the source of the first NMOS device. The second resistor is electrically coupled with the drain of the second PMOS device and the source of the second NMOS device. The first differential output pad is electrically coupled with the drain of the first PMOS device. The second differential output pad is electrically coupled with the drain of the second PMOS device.

In some embodiments, the sub-circuit comprises a third PMOS device and a third resistor. The source of the third PMOS is electrically coupled with the voltage domain, and the gate of the third PMOS is configured to receive a control signal to turn on or off current flow through the source and the drain of the third PMOS device. The third resistor is electrically coupled with the drain of the third PMOS device and the sources of the first and second PMOS devices.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

Figure (FIG. 1 illustrates a serializer/deserializer (SERDES) transmission system, in accordance with some embodiments of the present disclosure.

FIG. 14 illustrates performance comparisons between a SST TX driver and a shiftless SST TX driver circuit in accordance with some embodiments of the present disclosure.

DETAILED DESCRIPTION

Aspects of the present disclosure relate to a transmitter driver circuit that does not require a level shifter to connect to a pre-driver circuit. A transmitter driver circuit is used to regulate current flowing through a transmitter (TX). A TX is an electronic device that transmits data signal. A high speed and high swing serializer/deserializer (SERDES) TX is current consuming and requires a driver circuit to have high bandwidth and high launch amplitude.

Technical advantages of the present disclosure include, but are not limited to, reducing current consumption of both the pre-driver and driver circuits, increasing the bandwidth of the driver circuit, reducing distortion of pre-driver circuit output signal, and reducing layout areas for both the pre-driver and driver circuit.

Figure 1:
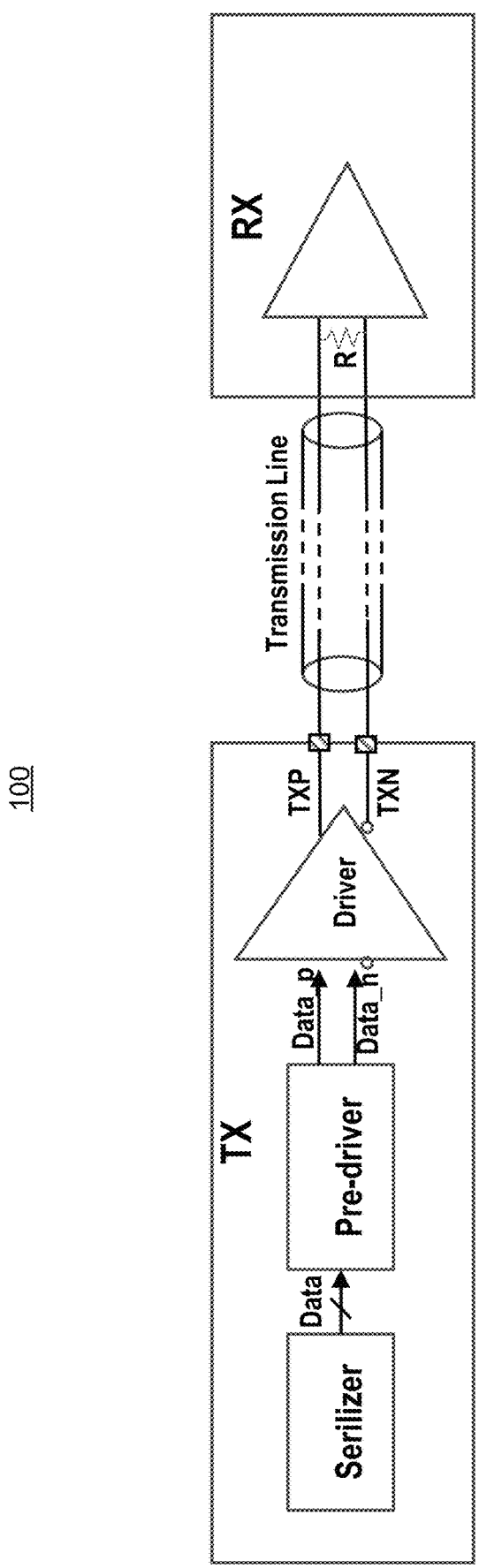

FIG. 1 illustrates a serializer/deserializer (SERDES) transmission system 100 in accordance with some embodiments. The SERDES transmission system 100 includes a transmitter (TX) and a receiver (RX). The transmitter TX transmits data signals to the receiver RX over a transmission line. The transmitter TX includes a sterilizer, a pre-driver, and a driver. The serializer is configured to convert a series of data from parallel to serial form. The serialized data is then input into the pre-driver, which output two data signals (denoted as Data_p and Data_n). Data_p and Data_n are in inverse phases with respect to each other. The driver receives Data_p and Data_n as input and transmits the data signal via two differential output pads TXP and TXN.

Figure 2A:
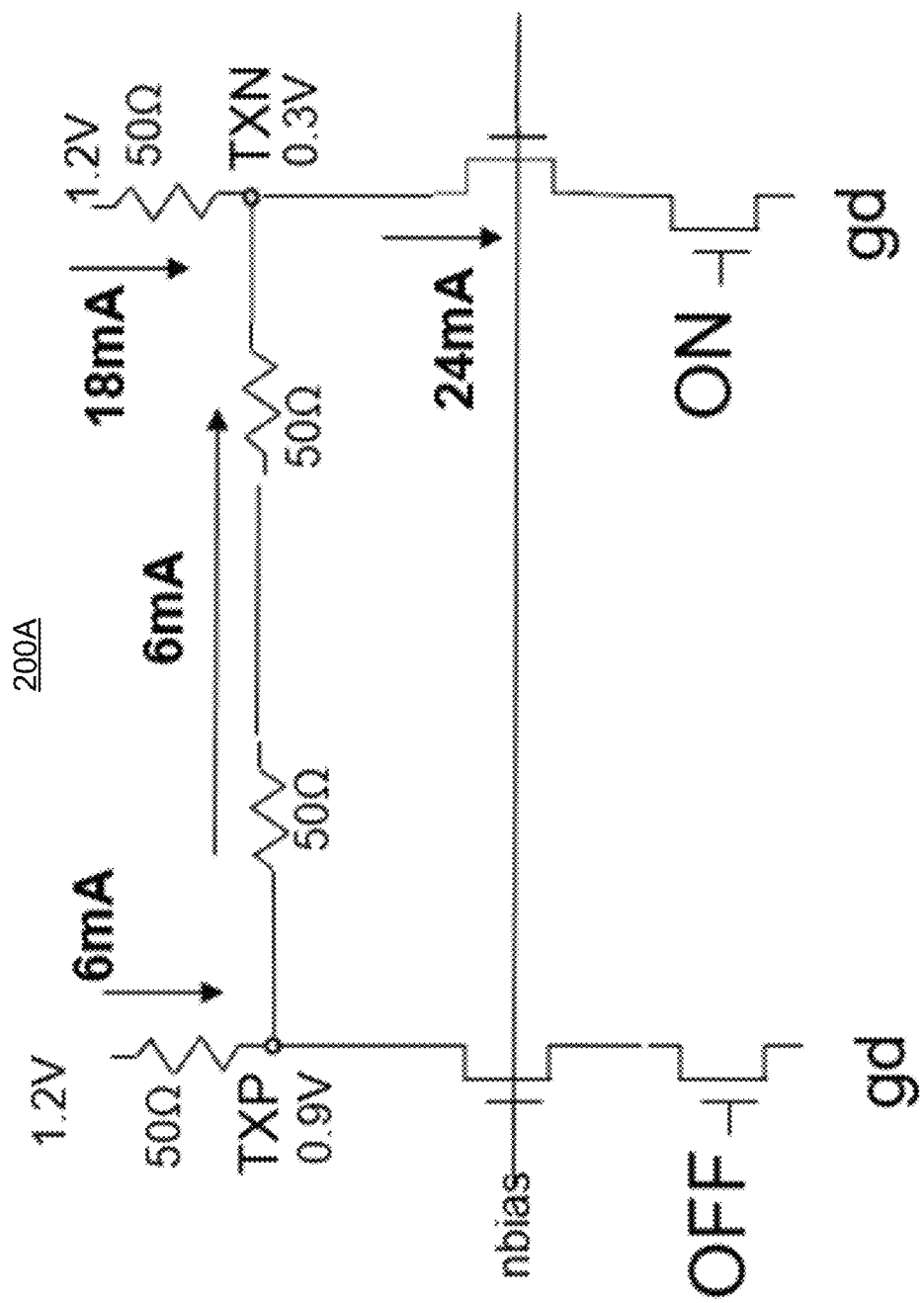
FIG. 2A illustrates an example of a current-mode logic (CML) driver, in accordance with some embodiments of the present disclosure.
Figure 2B:
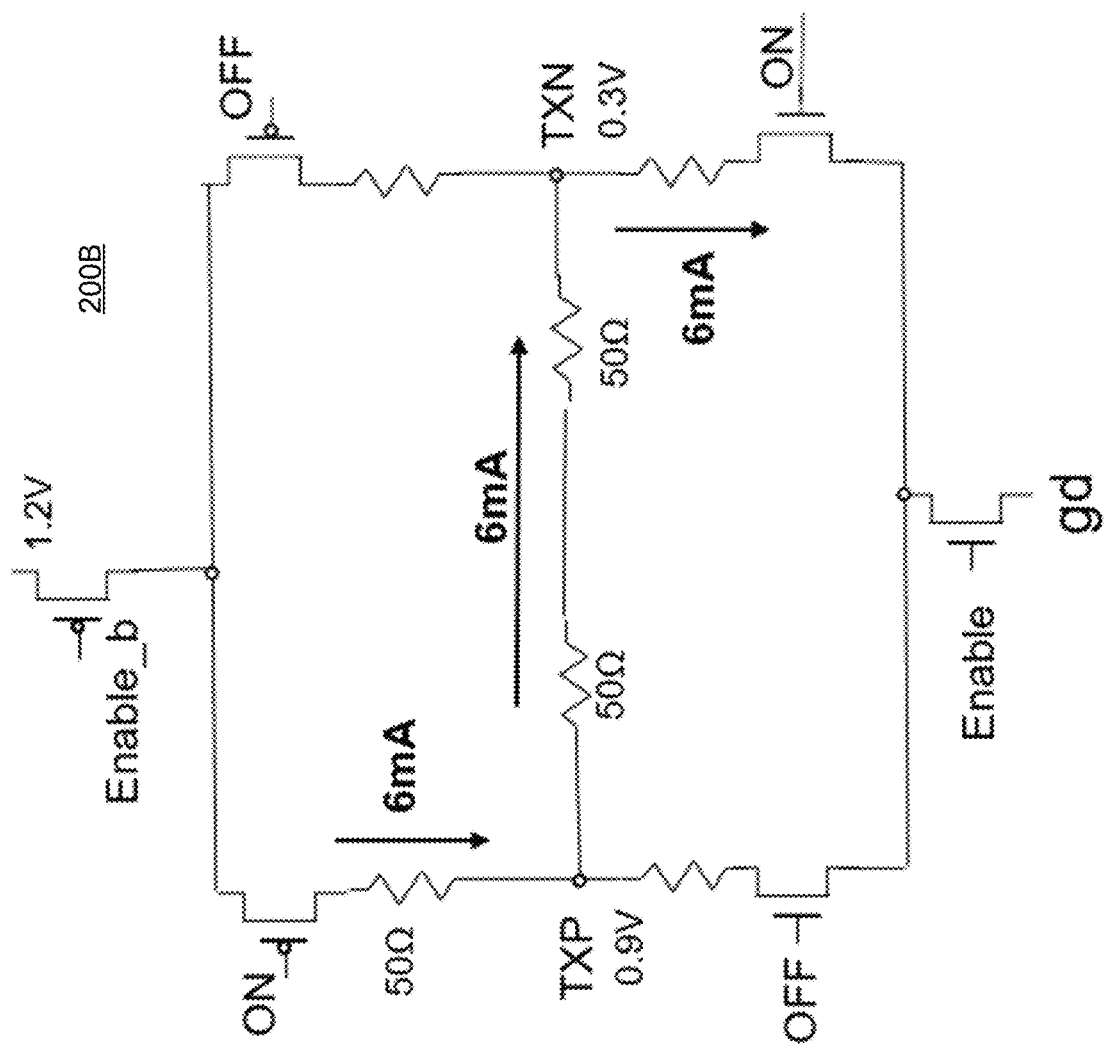
FIG. 2B illustrates an example of a source-series terminated (SST) transmitter (TX) driver circuit, in accordance with some embodiments of the present disclosure.

For a high speed and high swing TX driver, two topologies may be used. The first is a current-mode logic (CML) driver circuit, and the second is a source-series terminated (SST) driver circuit. FIG. 2A illustrates an example of a CML driver circuit 200A. FIG. 2B illustrates an example of a SST TX driver circuit 200B. The CML driver circuit 200Aan includes four NMOS devices and four resistors. The SST TX driver circuit 200 includes three PMOS devices, three NMOS devices, and six resistors.

Figure 3:
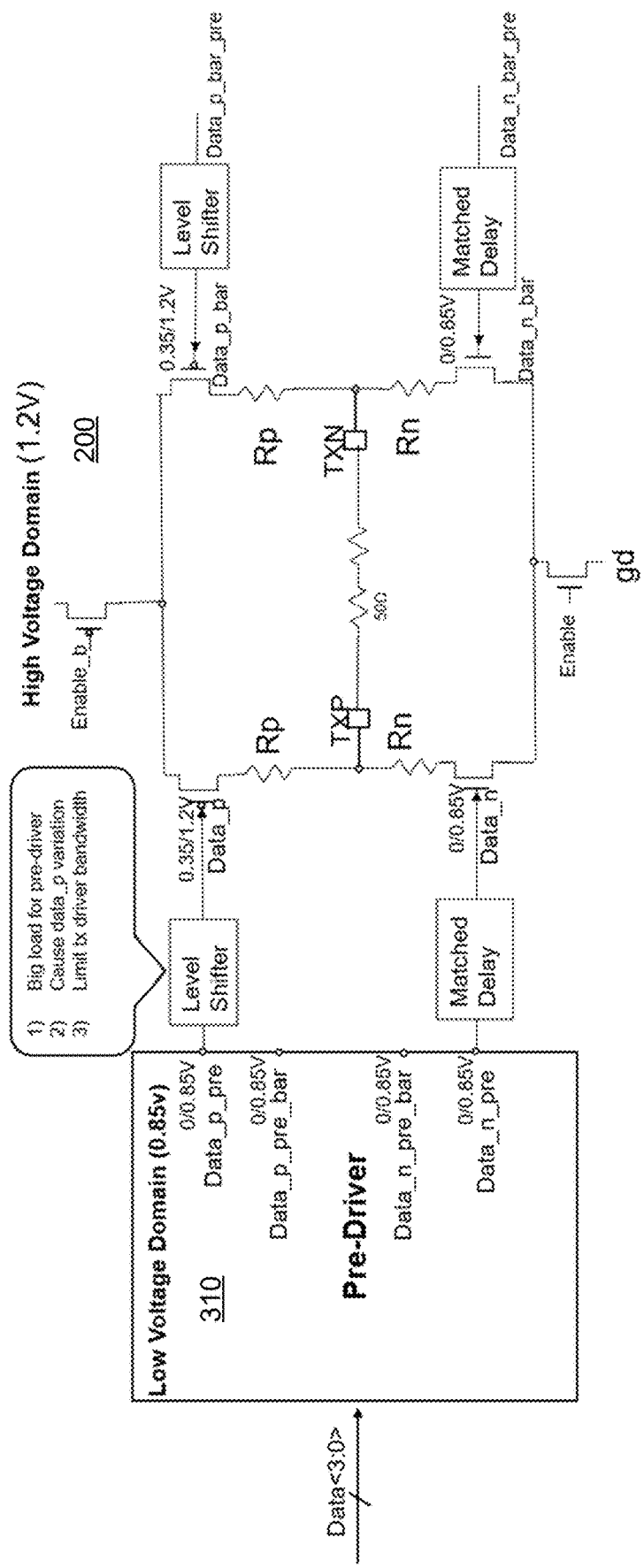
FIG. 3 illustrates an example of a SST TX driver that uses a relatively higher supply domain power coupled with a pre-driver that uses a relatively lower supply domain power in accordance with some embodiments of the present disclosure.

One drawback of such a CML driver is that it consumes a relatively large amount of DC current. For a driver with 1.2 volt (V) supply and 50 Ω impedance, a CML driver consumes 24 mA DC current while an SST driver consumes 6 mA DC current. Even though the SST TX driver circuit 200 consumes less current, it has its own disadvantages. For example, it is hard for the SST TX driver circuit 200 to achieve a relatively high swing. To obtain high swing, a low voltage pre-driver circuit is often coupled with the high voltage SST driver. FIG. 3 illustrates an example of the SST TX driver circuit 200 coupled with a pre-driver circuit 310 that uses a low supply domain (e.g., 0.85 V) power. To obtain high swing, a high supply domain (e.g., 1.2 V) power supply is used in the driver circuit 200. To move from a low supply domain of a pre-driver to a high supply domain of a driver, one or more level shifters are needed.

The level shifters are a drawback of the SST TX driver circuit 200 for at least the following reasons. First, the pre-driver circuit 310 requires a relatively big load. Due to the big load, the pre-driver circuit 310 consumes a relatively large current. Second, the signal (data_p) has a big variation over process, power supply voltage, and temperature (PVT) corners. Additionally, there is a bandwidth limit with the SST TX driver circuit 200, because the level shifter is coupled with a parasitic capacitor, and the parasitic capacitor causes signal degradation and limit the bandwidth of the SST drive.

The embodiments described herein address the shortcomings of conventional approaches. The disclosed embodiments introduce an SST TX driver circuit (hereinafter also referred to as "level-shiftless SST TX driver circuit" or "shiftless SST TX driver circuit") that does not require a level shifter to connect between a pre-driver circuit and a driver circuit.

Figure 4A:
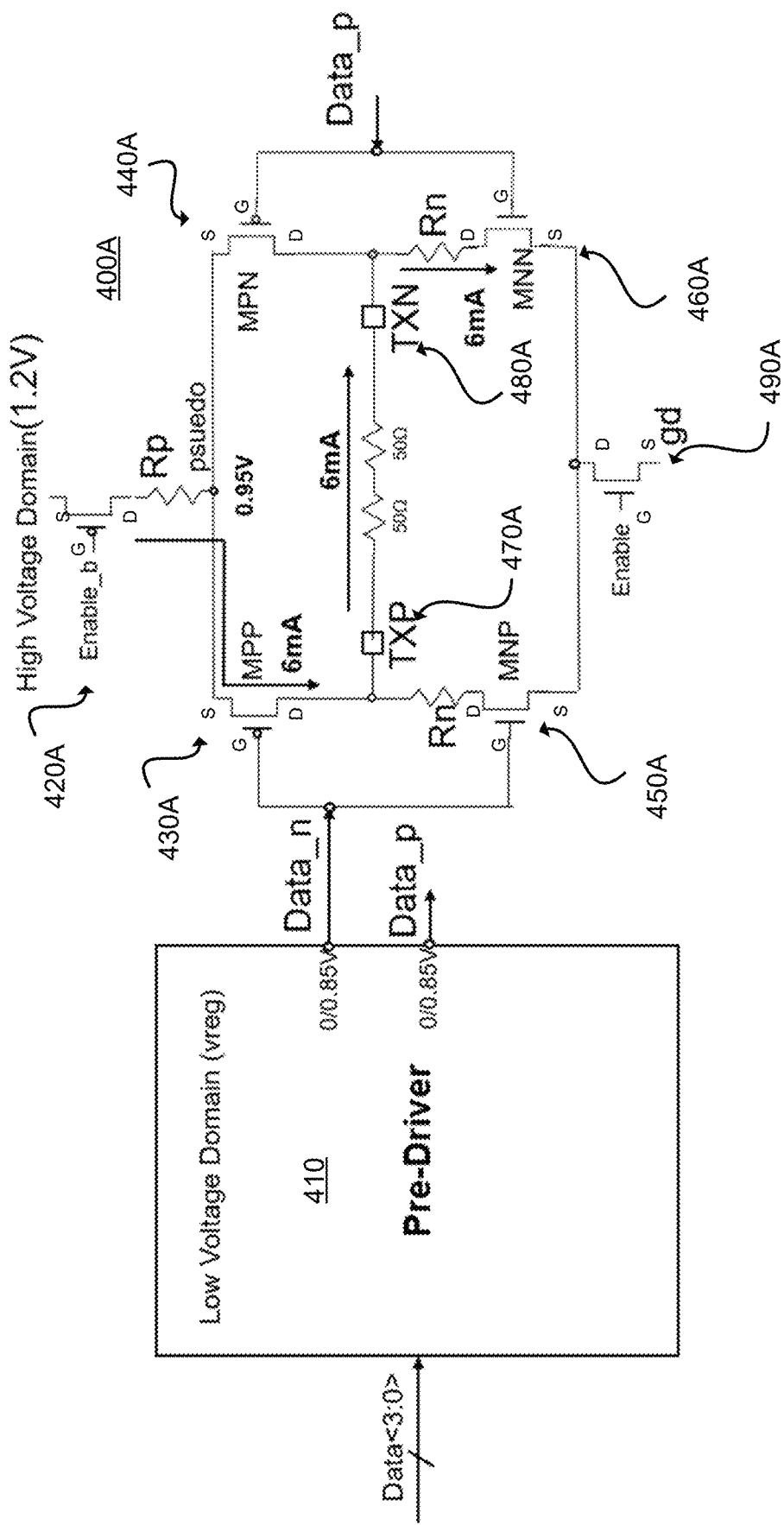
FIG. 4A illustrates an example of a level-shiftless (also referred to as shiftless) SST TX driver circuit in accordance with some embodiments of the present disclosure.

FIG. 4A illustrates an example of the shiftless SST TX driver circuit 400A coupled with a pre-driver circuit 410. The shiftless SST TX driver circuit 400A includes a first PMOS device 430A (MPP), a second PMOS device 440A (MPN), a first NMOS device 450A (MNP), a second NMOS device 460A (MNN), a first resistor (Rn on the left), a second resistor (Rn on the right), a third resistor (Rp at the top), a first differential output pad 470A (TXP), and a second differential output pad 480A (TXN). Each PMOS or NMOS device includes a gate terminal (G), a drain terminal (D), and a source terminal(S). Each resistor includes two terminals.

As illustrated in FIG. 4A, the source terminal of MPP 430A and the source terminal of MPN 440A are electronically coupled with each other. In some embodiments, the source terminal of MNP 450A and the source terminal of MNN 460A are electronically coupled, although in some embodiments the source terminals of MNP and MNN are not electrically connected. A first terminal of the first resister (Rn on the left) electronically connects to the drain terminal of MPP 430A, and a second terminal of the first resistor (Rn of the left) electronically connects to the drain terminal of MNP 450A. The second resistor (Rn on the right) electronically connects the drain terminal of MPN 440A and the drain terminal of MNN 460A. The gate terminal of MPP 430A and the gate terminal of MNP 450A are electronically coupled with receive a first data signal Data_n from pre-driver 410. The gate terminal of MPN 440A and the gate terminal of MNN 460A are electronically coupled with receive a second data signal Data_p from pre-driver that is in inverse phase with respect to the first data signal Data_n. The first differential output pad (TXP) 470A is electronically coupled with the drain terminal of MPP 430A and the first terminal of the first resistor (Rn on the left), and the second differential output pad (TXN) 480A is electronically coupled with the drain terminal of MPN 440A and the first terminal of the second resistor (Rn on the right).

A first terminal of the third resistor (Rp) is electrically coupled with a high voltage, and a second terminal of Rp electronically connects the source terminal of MPP 430A and the source terminal of MPN 440A. Notably, unlike the SST TX driver circuit 200 where the position of Rp is between each PMOS and Rn, the position of Rp of the shiftless SST TX driver circuit 400A is on the source terminal of PMOS side (MPP/MPN) to provide a voltage potential (i.e., IR) drop. The shiftless SST TX driver circuit 400A takes advantage of the IR drop of Rp to allow the PMOS devices (MPP/MPN) to work in the low voltage domain, such that no level shifter is required.

The two resistors between the differential pads TXP 470A and TXN 480A provide a load impedance. In different applications (e.g., driving different types of transmitters), the load impedance may be set at different values. In some embodiments, the load impedance is set as implemented as 100 Ω. In other embodiments, the load resistance is set as 50 Ω. In some embodiments, the load impedance is adjustable based on a transmitter driven by the driver circuit.

In some embodiments, the shiftless SST TX driver circuit 400A also includes two enabling PMOS/NMOS devices 420A, 490A, one at the top connecting the high voltage to the third resistor Rp, the other at the bottom connecting ground to the source terminals of the first and second NMOS. The gate terminal of each enabling PMOS/NMOS device 420A, 480A receives a control signal to allow or block the flow of current from the source terminal to the drain terminal. In some embodiments, when the control signal is high, the enabling PMOS/NMOS device 420A, 480A switches on and allows current to flow through; when the control signal is low, the enabling PMOS/NMOS device 420A, 480A switches off and blocks the flow of current.

Figure 4B:
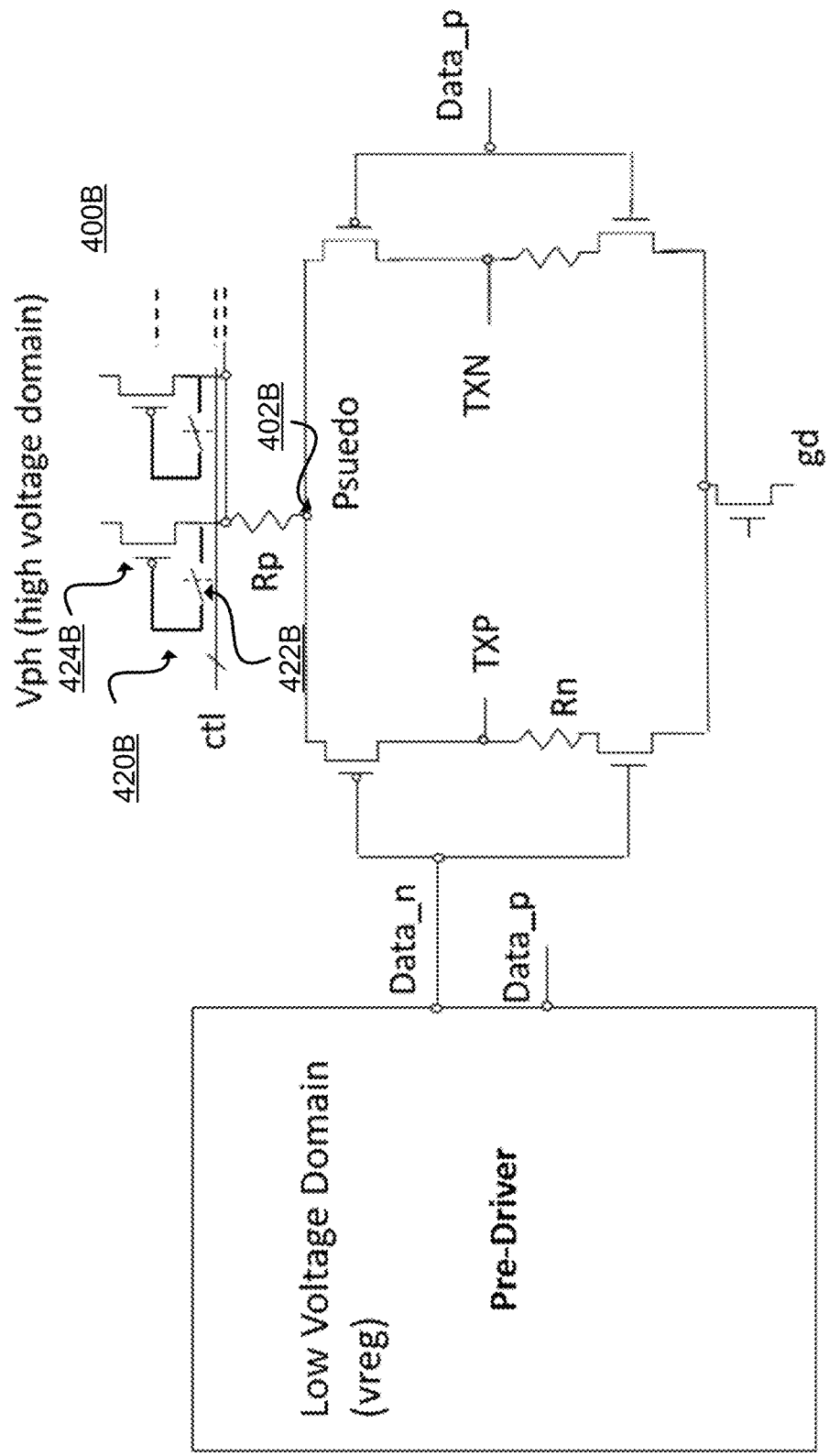
FIG. 4B illustrates an example of a shiftless SST TX driver circuit with a programmable diode array in accordance with some embodiments of the present disclosure.

FIG. 4B illustrates an example of a shiftless SST TX driver circuit 400B with a programmable diode array circuit 420B in accordance with some embodiments. The shiftless SST TX driver circuit 400B may be derived from the shiftless SST TX driver circuit 400A of FIG. 4A by replacing the enabling PMOS device 420A at the top with a programmable diode array 420B.

Each of the programmable diodes in the circuit 420B can be controlled using a set of control signals (ctl). In some embodiments, each programmable diode is configured to be switched between being an open circuit and a conducting diode, depending on the control signal. As illustrated in FIG. 4B, each programmable diode is coupled with a PMOS device. For example, the two terminals of the programmable diode 422B are connected to the gate terminal and drain terminals of the PMOS device 424B. Depending on the control signals, the impedance of the programmable diode array circuit 420 (Rdiode) is adjustable, which in turn adjusts node voltage at node 402B (Psuedo) and/or impedance (Rp+Rdiode) on the PMOS side.

Figure 4C:
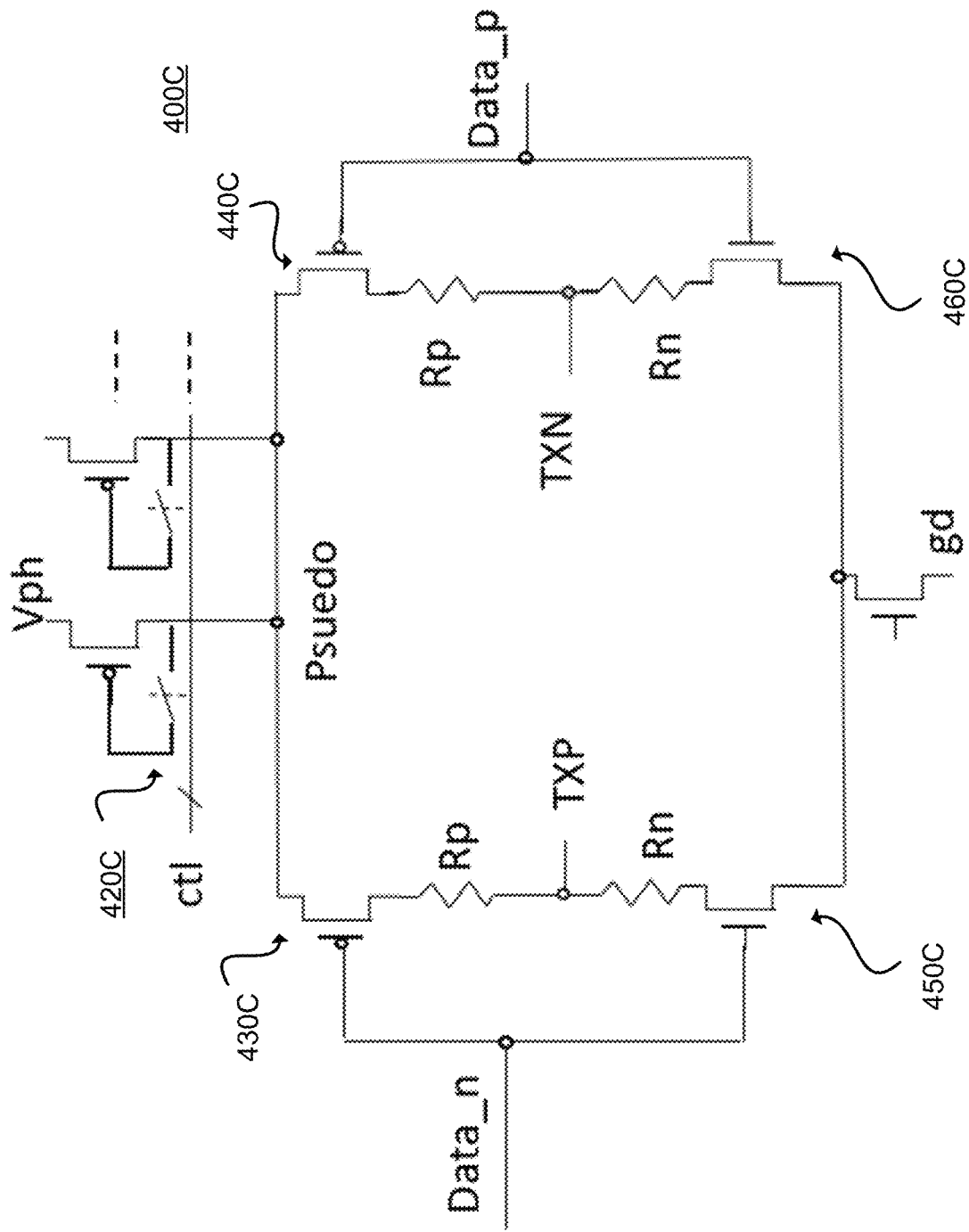
FIG. 4C illustrates another example of a shiftless SST TX driver circuit with a programmable diode array in accordance with some embodiments of the present disclosure.

FIG. 4C illustrates another example of a shiftless SST TX driver circuit 400C with a programmable diode array 420C in accordance with some embodiments. The shiftless SST TX driver circuit 400C may be derived from the shiftless SST TX driver circuit 400B of FIG. 4B by moving the single resistor Rp above PMOS 420C/440C to two locations below PMOS 420C/440C. The movement of the resistor Rp provides better electrostatic discharge (ESD) protection at a low swing cost. The impedance above PMOS is Rdiode, as such the programmable diode array here allows adjustment of the pseudo node voltage Rdiode as well as the output swing.

Figure 4D:
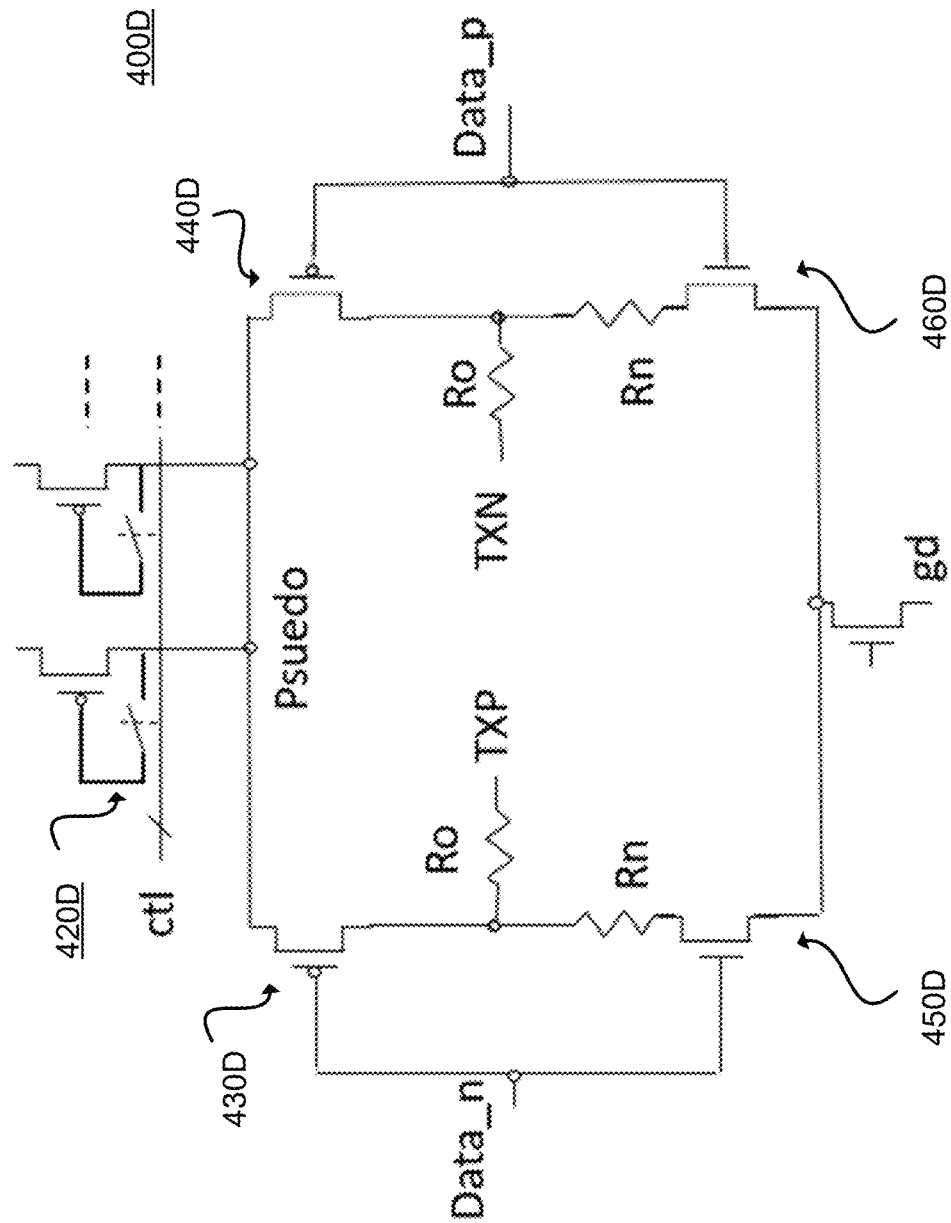
FIG. 4D illustrates another example of a shiftless SST TX driver circuit with a programmable diode array in accordance with some embodiments of the present disclosure.

FIG. 4D illustrates another example of a shiftless SST TX driver circuit 400D with a programmable diode array 420D in accordance with some embodiments. The shiftless SST TX driver circuit 400D may be derived from the shiftless SST TX driver circuit 400C of FIG. 4C by removing resistors Rp and adding Ro at output pads TXP and TXN. Removing resistors Rp and adding resistors Ro provides better ESD protection and also improves bandwidth.

Figure 4E:
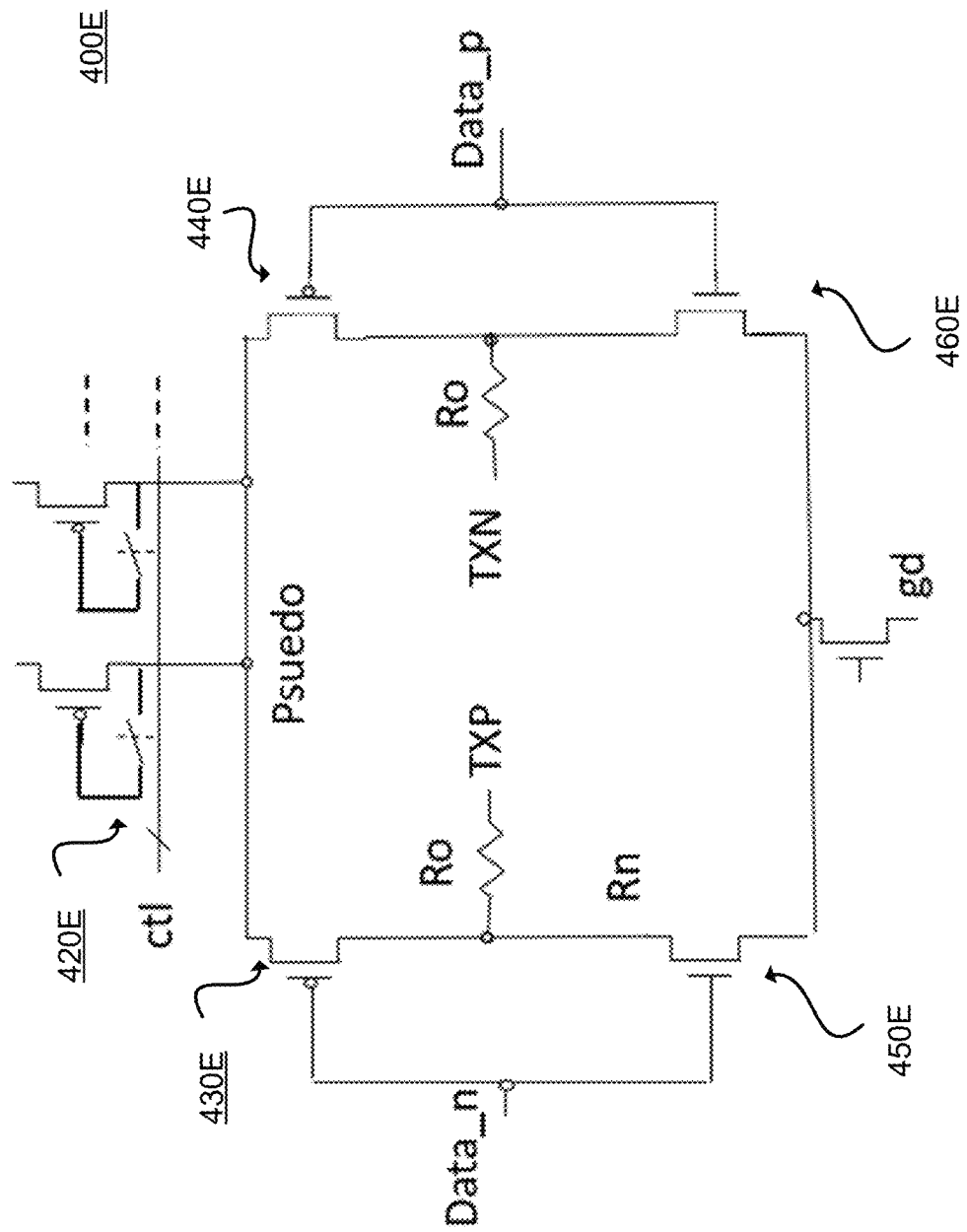
FIG. 4E illustrates another example of a shiftless SST TX driver circuit with a programmable diode array in accordance with some embodiments of the present disclosure.

FIG. 4E illustrates another example of a shiftless SST TX driver circuit 400E with a programmable diode array 420E in accordance with some embodiments. The shiftless SST TX driver circuit 400E may be derived from the shiftless SST TX driver circuit 400D of FIG. 4D by removing resistors between NMOS 450D/460D and differential output pads TXP and TXN.

Figure 5A:
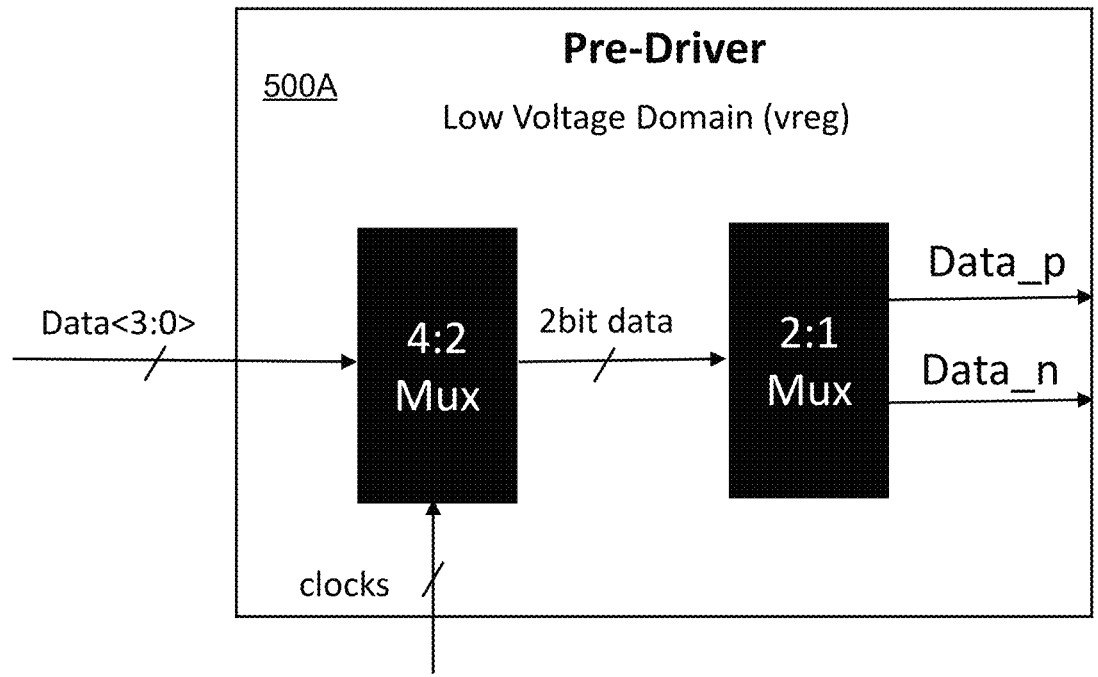
FIG. 5A shows a high-level block diagram of a pre-driver circuit that may be coupled with a shiftless SST TX driver circuit in accordance with some embodiments of the present disclosure.

FIG. 5A shows a high-level block diagram of an example pre-driver circuit 500A, which may correspond to the pre-driver circuit 410 coupled with the shiftless SST TX driver circuit 400A of FIG. 4A. Input of the pre-driver circuit 500A is 4-bit wide quarter-rate data (denoted as Data<3:0>) which gets serialized to 2-bit half-rate data using a 4:2 multiplexer. The output of the 4:2 multiplexer further gets serialized to 1-bit full rate data using 2:1 multiplexer, denoted data_p and data_n.

Figure 5B:
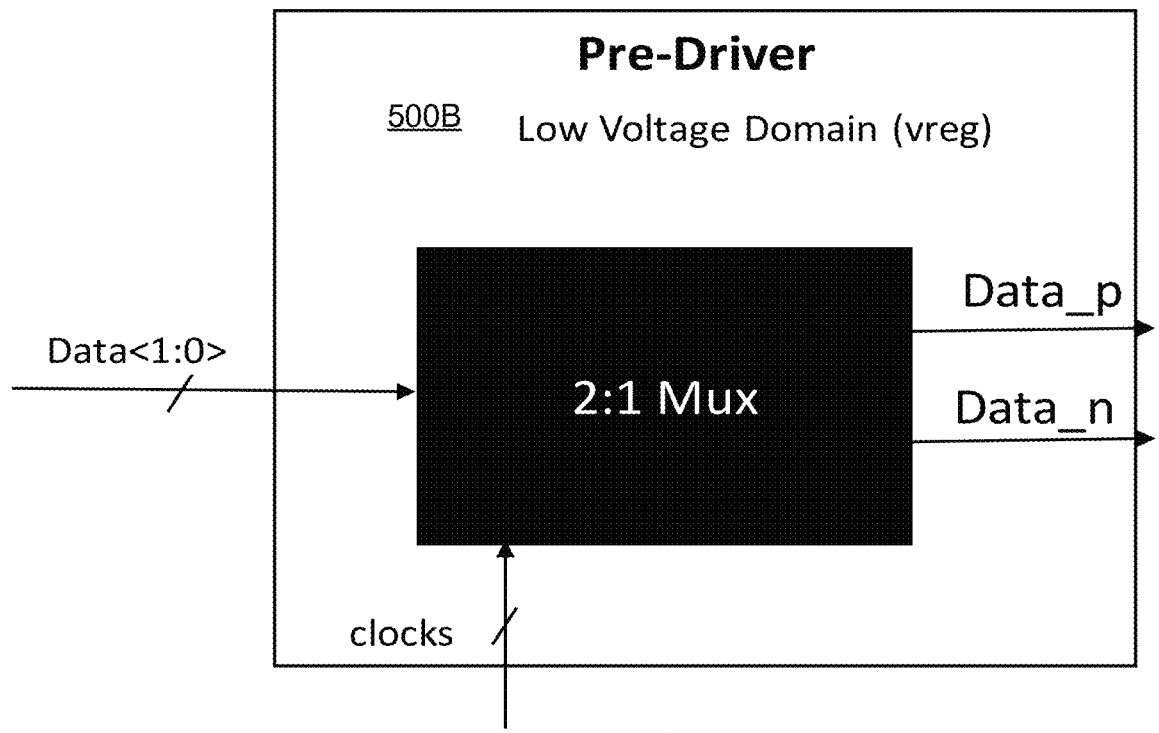
FIG. 5B shows a high-level block diagram of another pre-driver circuit that may be coupled with a shiftless SST TX driver circuit in accordance with some embodiments of the present disclosure.

FIG. 5B shows a high-level block diagram of another example pre-driver circuit 500B, which may correspond to the pre-driver circuit 410 coupled with the shiftless SST TX driver circuit 400A of FIG. 4A. Input of the pre-driver circuit 500A i-2-bit wide half-rate data (denoted as Data<1:0>) which gets serialized to 1-bit full rate dating using 2:1 multiplexer, denoted data_p and data_n.

The two 1-bit data signals, data_p and data_n (in FIG. 5A or 5B) are the same data signals with inverse phase, which are input to the transmitter SST TX driver circuit 400A. To save power and get faster speed, pre-driver circuit 410 works on a low voltage domain (Vreg), e.g., Vreg=0.85 V, while the driver circuit 400A works on a high voltage domain, e.g., Vph=1.2 V.

Figure 6A:
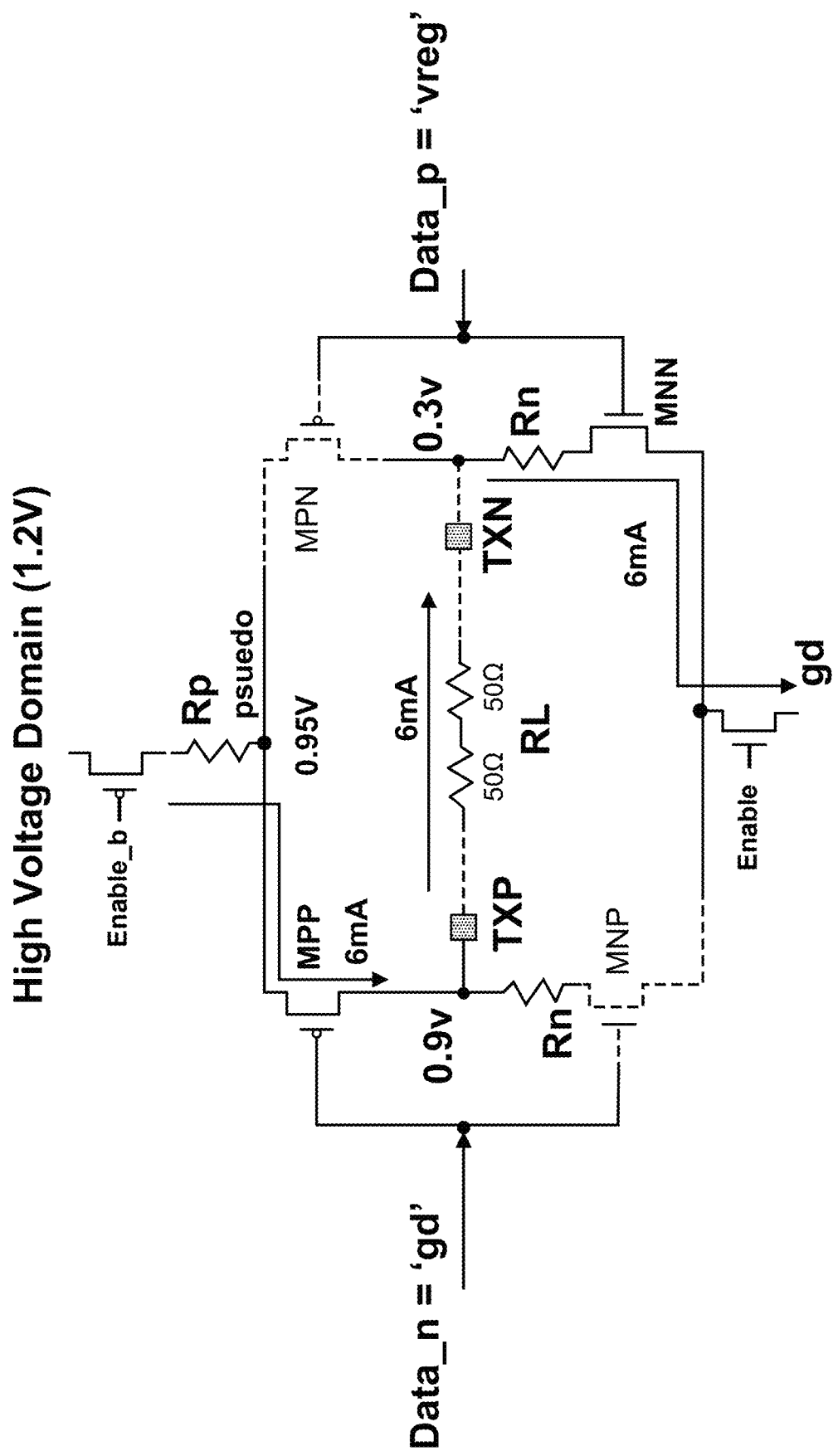
FIG. 6A shows a direct current (DC) operation of the shiftless SST TX driver circuit when current between two differential output pads flows in a first direction in accordance with some embodiments of the present disclosure.

FIG. 6A shows a DC operation of the shiftless SST TX driver circuit 400A when Data_p= 'vreg' and Data_n= 'gd.' Data_p= 'vreg' means Data_p is high (e.g., 0.85 V) and Data_n= 'gd' means Data_n is low (e.g., 0 V). Hence, PMOS MPP is turned on and PMOS MPN is turned off. At the same time, NMOS MNN is turned on and NMOS MNP is turned off. TXP/TXN are the outputs of a chip (e.g., transmitter) and RL is the impedance at a receiver. TXP voltage is high (around 0.9 V) and TXN voltage is low (around 0.3 V), causing the current to flow from TXP to TXN.

Figure 6B:
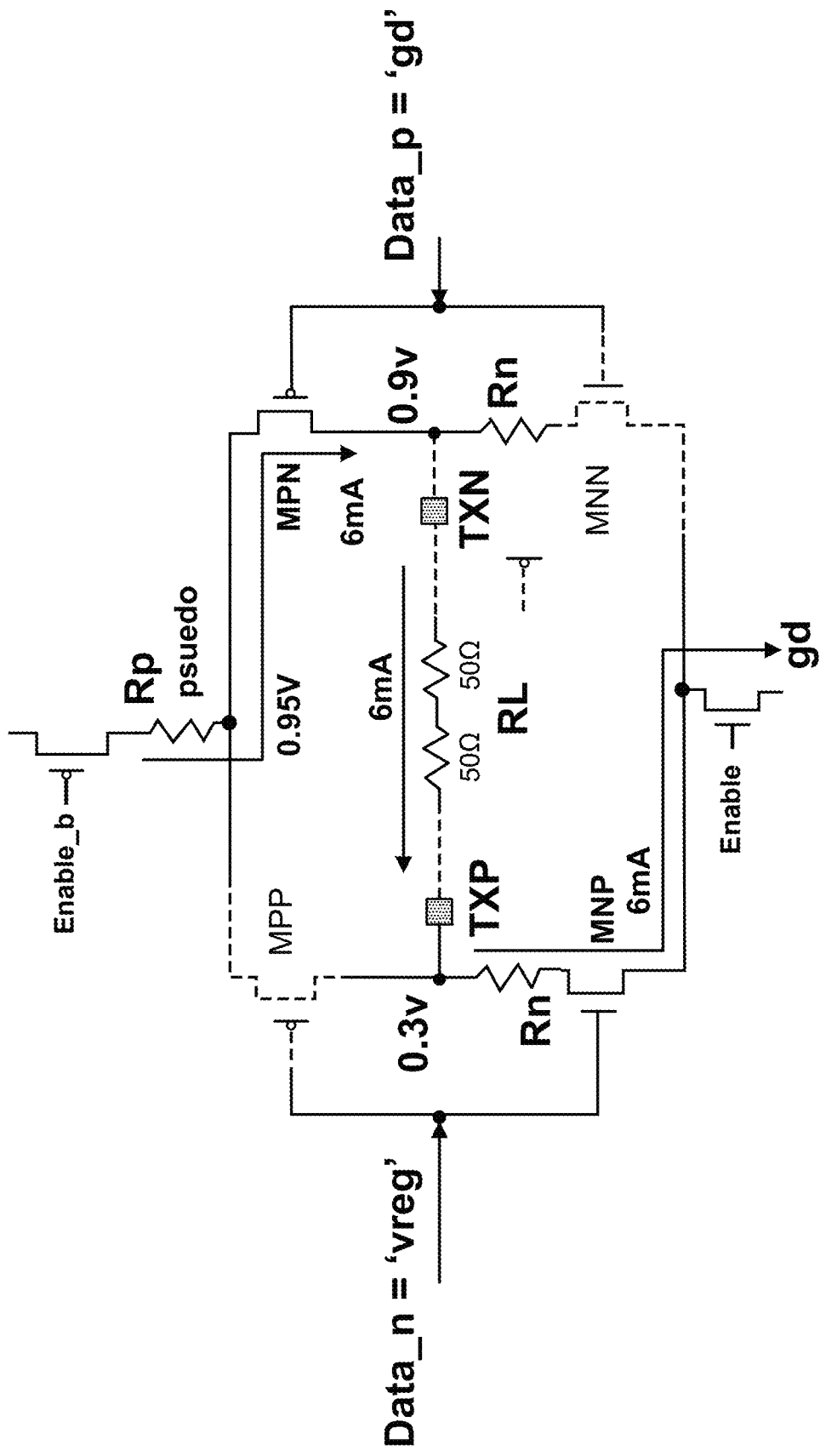
FIG. 6B shows an opposite DC operation of the shiftless SST TX driver circuit when current between tow differential output pads flows in a second direction opposite to the first direction shown in FIG. 6A in accordance with some embodiments of the present disclosure.

FIG. 6B shows an opposite DC operation, when Data_p= 'gd', Data_n= 'vreg'. The current direction in FIG. 6B is opposite to that in FIG. 6A. In particular, PMOS MPP is turned off and PMOS MPN is turned on. At the same time, NMOS MNN is turned off and NMOS MNP is turned on. TXP voltage is low (around 0.3 V) and TXN voltage is high (around 0.9 V), causing the current to flow from TXN to TXP.

The shiftless SST TX driver circuit 400A described herein provides many benefits over the SST TX driver circuit 200. First, since the level shifter is removed, the capacitance load of pre-driver can be reduced by about one-third. In addition to the NMOS and PMOS devices in the driver circuit 200 or 400A that has a parasitic capacitance each level shifter also has a parasitic capacitance. Such parasitic capacitances contribute the pre-driver's load. Since the shiftless SST TX driver circuit 400A does not require level shifters, the pre-driver load is significantly reduced, and pre-driver current consumption can be significant reduced.

Figure 7:
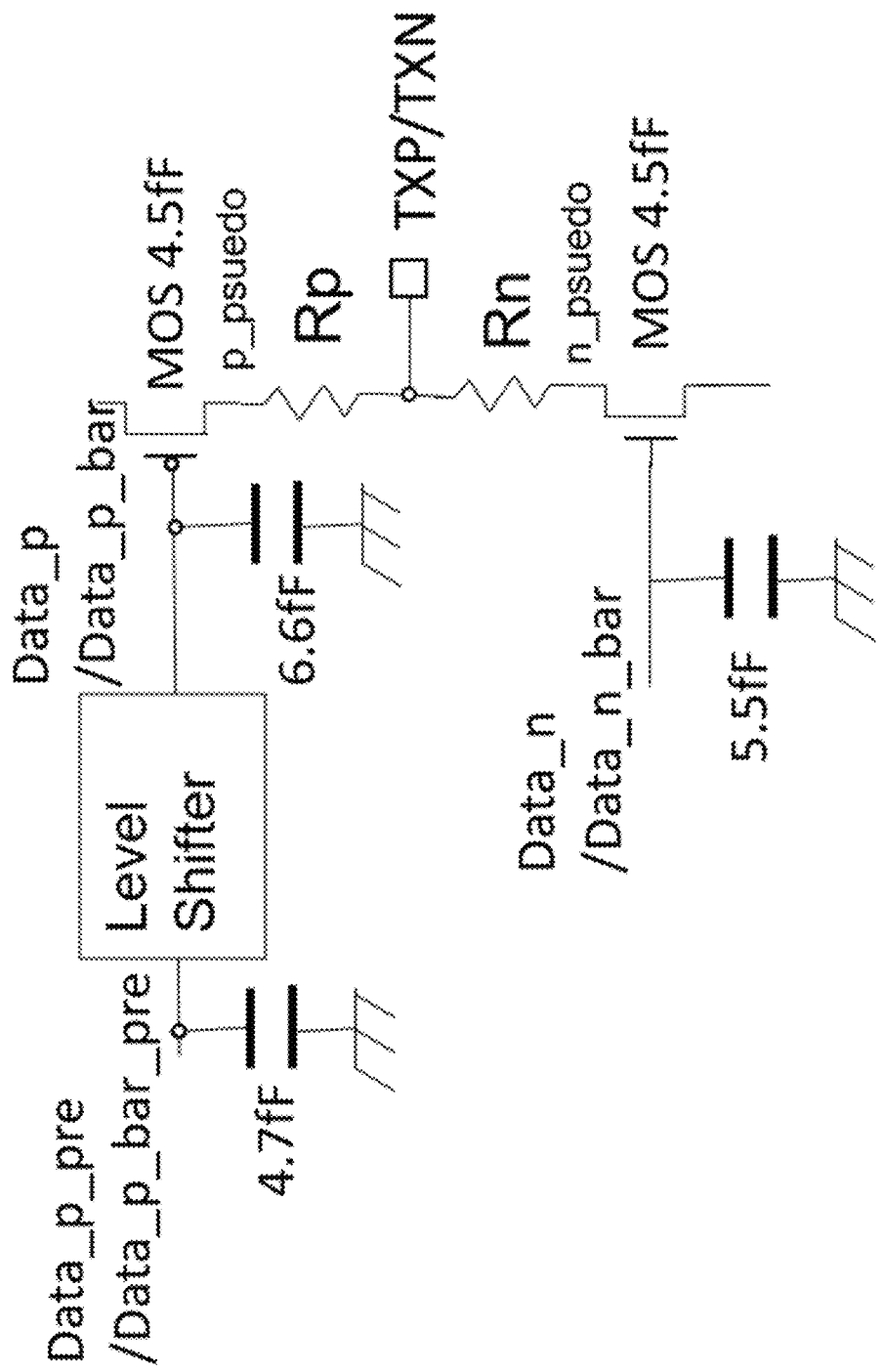
FIG. 7 illustrates example parasitic capacitances from the pre-driver output to a SST TX driver circuit.
Figure 8:
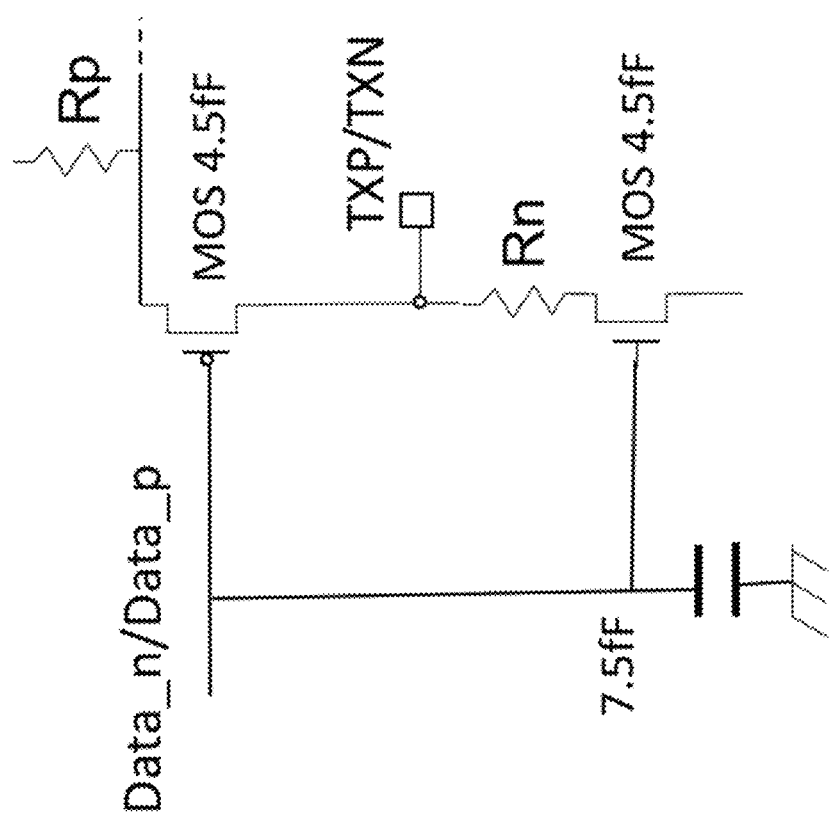
FIG. 8 illustrates an example parasitic capacitance from the pre-driver output to the shiftless SST TX driver circuit in accordance with some embodiments of the present disclosure.

FIG. 7 illustrates example parasitic capacitances from the pre-driver output to the SST TX driver circuit 200 with a level shifter. FIG. 8 illustrates example parasitic capacitance from the pre-driver output to the shiftless SST TX driver circuit 400A in accordance with some embodiments described herein. As illustrated in FIG. 7, there is a parasitic capacitance of 4.7 fF before the level shifter, a parasitic capacitance of 6.6 fF after the level shifter at the gate terminal of the PMOS device, a 4.5 fF MOS capacitor at the gate of the PMOS device, a parasitic capacitance of 5.5 fF at the gate terminal of the NMOS device, and a 4.5 fF MOS capacitor at the gate of the NMOS device. As such, the total load of capacitance from the pre-driver is 25.8*N fF=(4.7+6.6+5.5+4.5+4.5)*N. Note, N is a total number of cells in the SST TX driver. For example, in some embodiments, there are 13 cells in the TX driver, i.e., N=13, and the total capacitance is 335.4 fF (=25.8×13).

On the other hand, referring to FIG. 8, there is a parasitic capacitance of 7.5 fF at the gate terminals of the PMOS device and NMOS device, a 4.5 fF MOS capacitor at the gate of the PMOS device, and a 4.5 fF MOS capacitor at the gate of the NMOS device. As such, the total parasitic capacitance is 16.5*N fF=(7.5+4.5+4.5)*N. In embodiments, where N=13, the total capacitance is 214.5 fF (=16.5×13). As such, when N=13, the pre-driver load of capacitance is reduced from 335.4 fF to 214.5 fF, which is more than ⅓ of reduction. Notably, a pre-driver is a current hungry block. By reducing the capacitance load, the current consumption of the pre-driver is significantly reduced.

Figure 9:
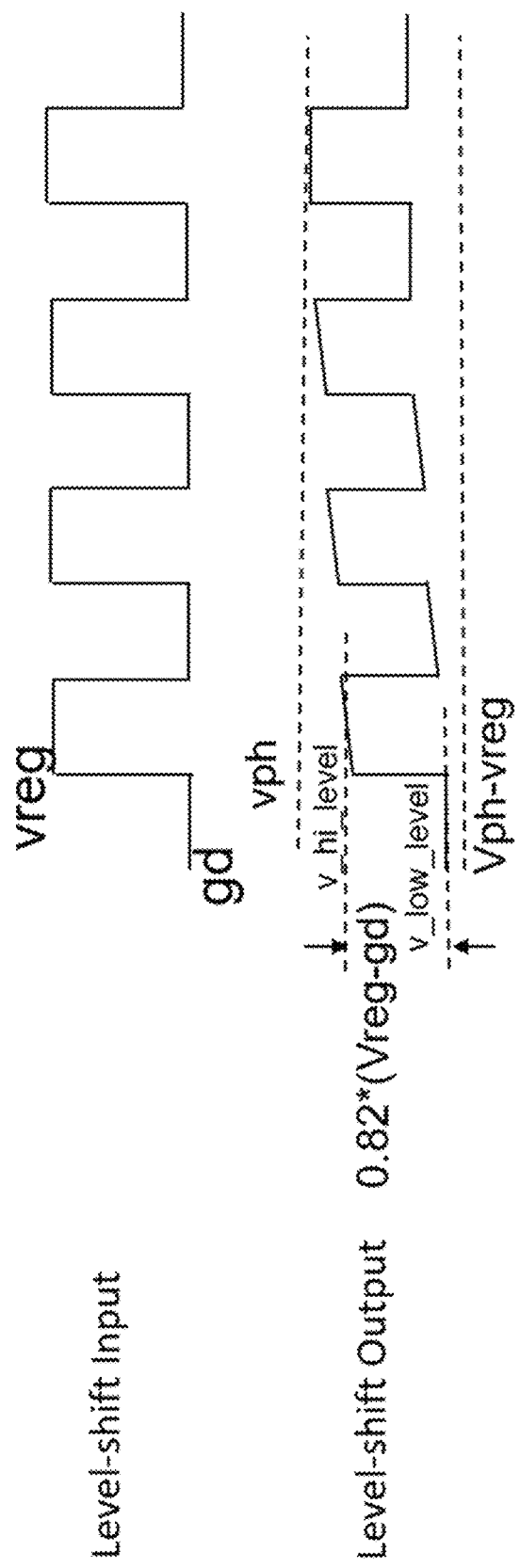
FIG. 9 illustrates example input and output signals of a level shifter coupled with a SST TX driver circuit.

Further, the capacitance load affects the quality of the output signal of the pre-driver circuit 310 or 410. By reducing the capacitance load, the output signal of the pre-driver for the shiftless SST TX driver circuit 400A has much better quality than the SST TX driver circuit 200 with a level shifter. FIG. 9 illustrates a level-shift input/output in the SST TX driver circuit 200. As illustrated in FIG. 9, there is a big distortion and variation at the SST pre-driver output signal due to the big load and the inclusion of level shifts. Because the level shifters in the SST TX driver circuit 200 cause a long settling time, the removal of the level shifters eliminates (or substantially reduces) the settling time.

Figures 10A, 10B:
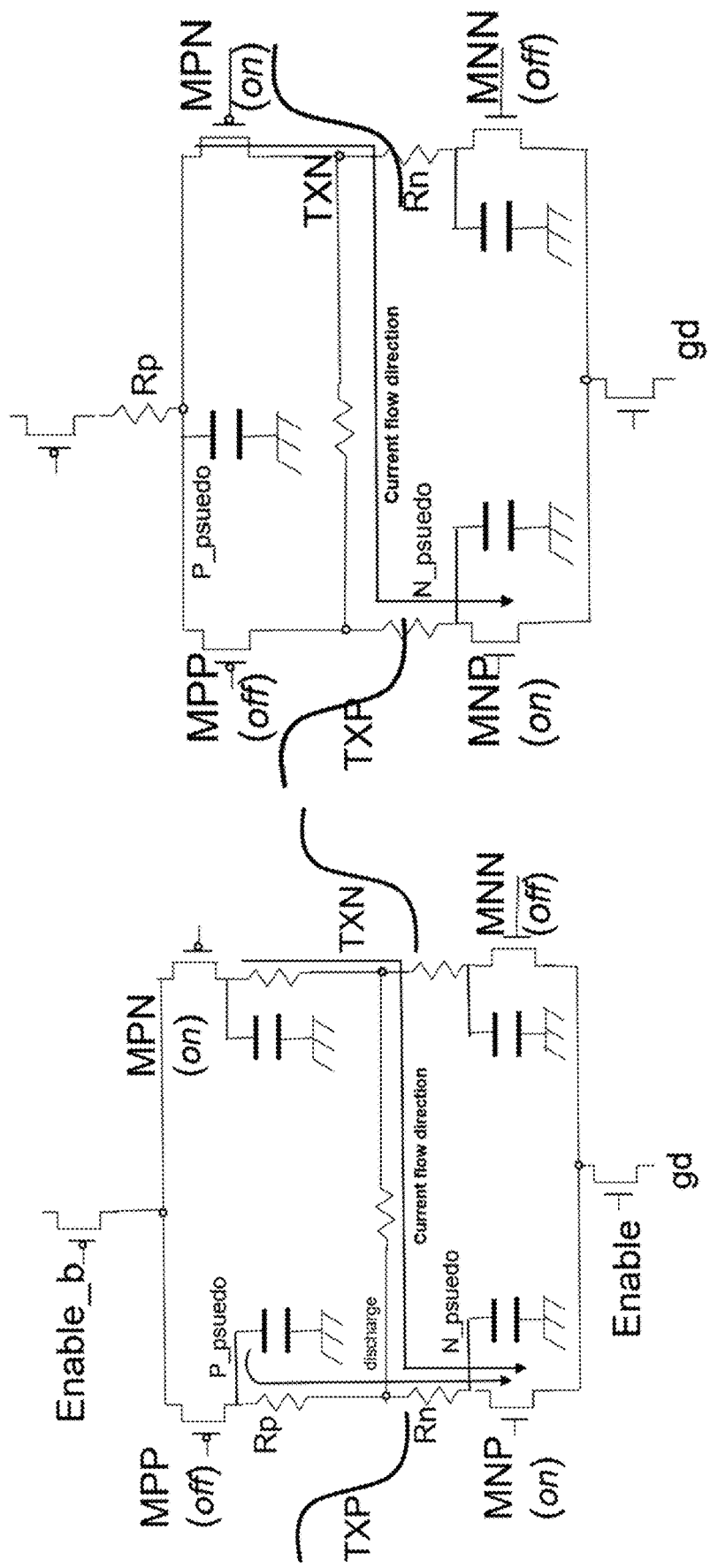
FIG. 10A illustrates a current flow diagram of an SST TX driver circuit when potential of TXP is falling and potential of TXN is rising.
FIG. 10B illustrates a current flow diagram of a shiftless SST TX driver circuit when potential of TXP is falling and potential of TXN is rising in accordance with some embodiments of the present disclosure.

Additionally, the shiftless SST TX driver circuit 400A has inherently higher bandwidth than the SST TX driver circuit 200. FIG. 10A illustrates a current flow diagram of the SST TX driver circuit 200 when potential of TXP is falling and potential of TXN is rising. FIG. 10B illustrates a current flow diagram of the shiftless SST TX driver circuit 400A when potential of TXP is falling and potential of TXN is rising.

As shown in FIG. 10A, for the SST TX driver circuit 200, during TXP's potential falling, p_psuedo node capacitor is discharged through (Rp+Rn). However, as shown in FIG. 10B, for the shiftless SST TX driver circuit 400A, during TXP's potential falling, p_suedo node capacitor does not need to discharge; and during TXN's potential rising, TXN is driven by MPP and MPN, different from those of the SST TX driver circuit 200. At the switching transient of the shiftless SST TX driver circuit 400A, the turning on of MPN will source out a bigger current due to the differential pair (MPP and MPN) structure, compared to the SST TX driver circuit 200 (the speed is limited by the current path impedance and parasitic capacitor along the path),. As such, the shiftless SST TX driver circuit 400A has inherently higher bandwidth than the SST TX driver circuit 200, which is further illustrated in FIG. 11.

Figure 11:
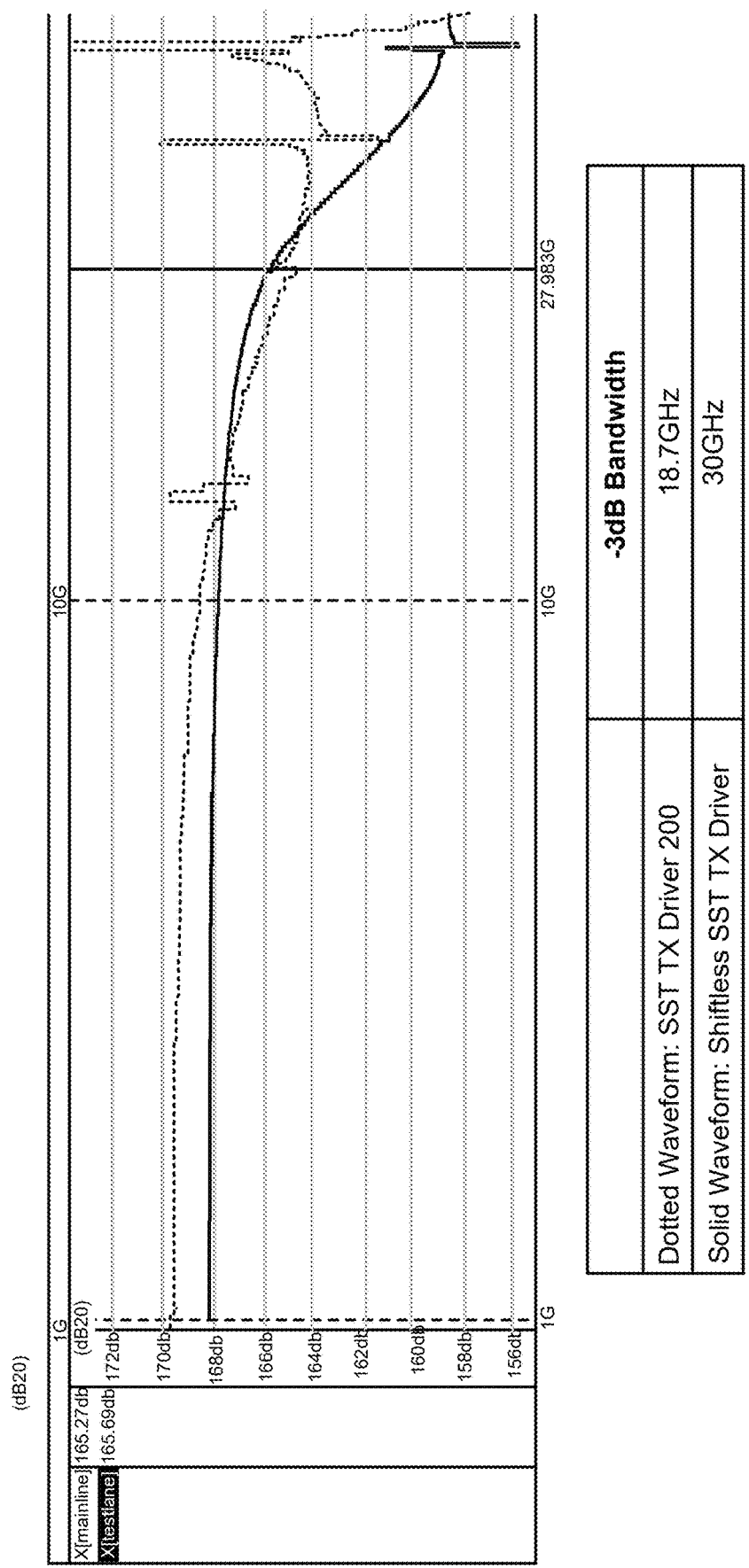
FIG. 11 illustrates example FFT results for derivative impulse response with step response transient simulation for the SST TX driver circuit and the shiftless SST TX driver circuit in accordance with some embodiments of the present disclosure.

FIG. 11 illustrates example FFT results for the derivative impulse response with step response transient simulation for the SST TX driver 200 and the shiftless SST TX driver circuit. As illustrated, the −3 dB bandwidth of the SST TX driver 200 is 18.7 GHZ, and the −3 dB bandwidth of the shiftless SST TX driver circuit is 30 GHz which is much wider than that of the SST TX driver 200.

Additionally, for the SST TX driver circuit 200, a bigger load capacitance slows down the rising/falling edge of the pre-driver circuit output signal, causing the output signal of the level shifters to be distorted from the output signal of pre-driver. As such, the output signal of level shifters results in bigger mismatches within the transmitter and bigger variation over process, power supply voltage, and temperature (PVT) corner. The shiftless SST TX driver circuit 400A eliminates the requirement of level shifters, reducing the distortion caused by level shifters.

Finally, the SST TX driver 200 requires a bigger layout area for the pre-driver circuit due to the requirement of the level shifters. A more complicated circuit is required for the pre-driver for the SST TX driver 200 because the SST TX driver 200's performance is sensitive to the pre-driver Inter Symbol Interference (ISI) skew. The large load and level shifters degrade the pre-driver output, which leads to bad ISI skew. Thus, to avoid bad ISI skews, the SST TX driver circuit 200 requires a more complicated half-rate pre-driver circuit that takes a larger layout area. On the other hand, a full rate driver based on the shiftless SST TX driver circuit 400A can use a simplified pre-driver to reduce layout area.

Figure 12:
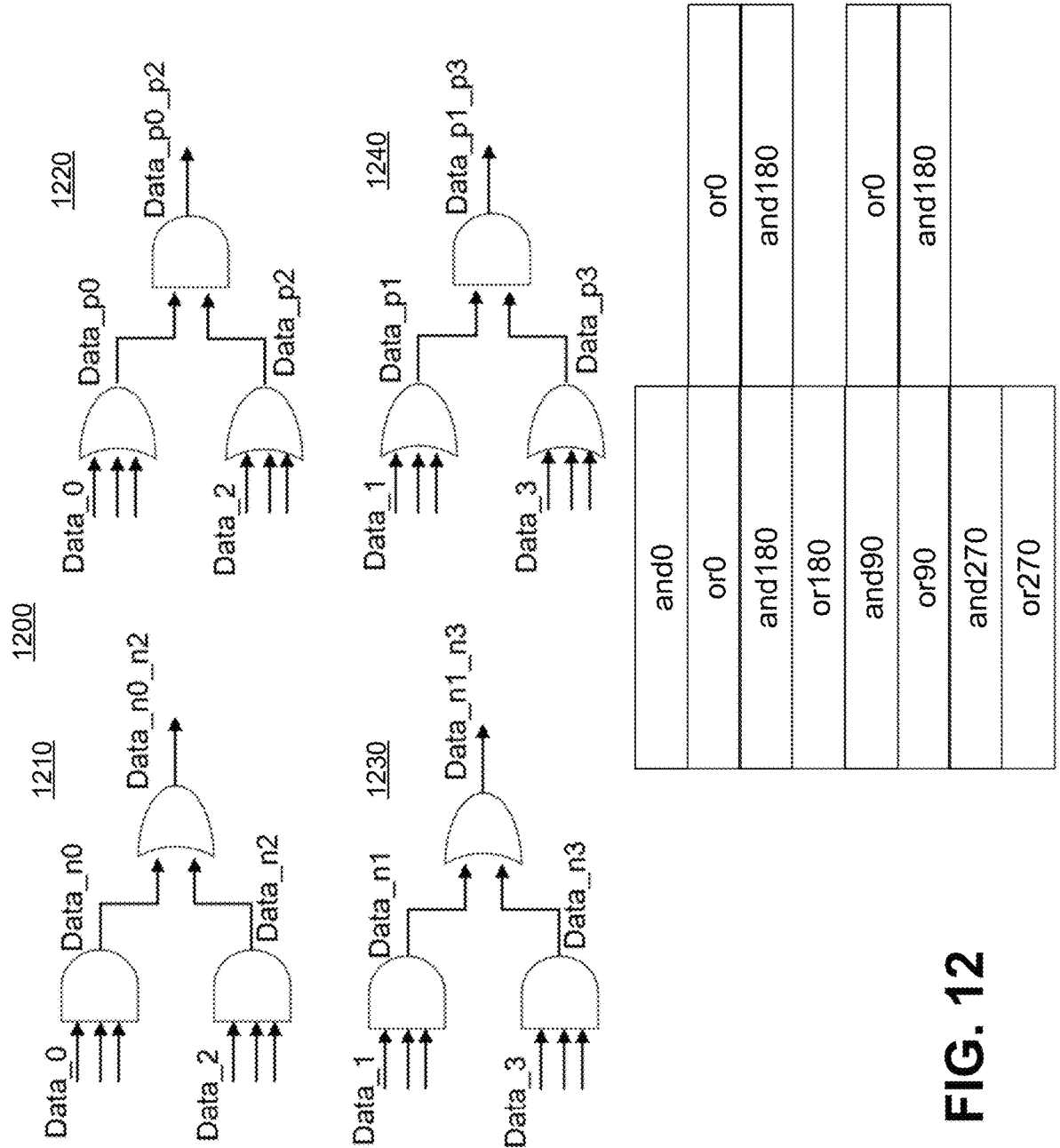
FIG. 12 illustrates an example pre-driver circuit 1200 for the SST TX driver circuit.

FIG. 12 illustrates an example pre-driver circuit 1200 for the SST TX driver circuit 200. The pre-drive circuit 1200 includes four 2:1 multiplexer 1210, 1220, 1230, 1240. Multiplexer 1210 receives, as inputs, Data_0 and Data_2 to output Data_n0_n2. Multiplexer 1220 receives, as inputs, Data_0 and Data_2 to output Data_p0_p2. Multiplexer 1230 receives, as inputs, Data_1 and Data_3 to output Data_n1_n3. Multiplexer 1240 receives, as inputs, Data_1 and Data_3 and serializes the inputs to output Data_p1_p3. The four output data signals Data_n0_n2, Data_p0_p2, Data_1_n3, and Data_p1_p3 are then input to the gate terminals of the two PMOS devices and two NMOS devices of the SST TX driver circuit 200.

Figure 13:
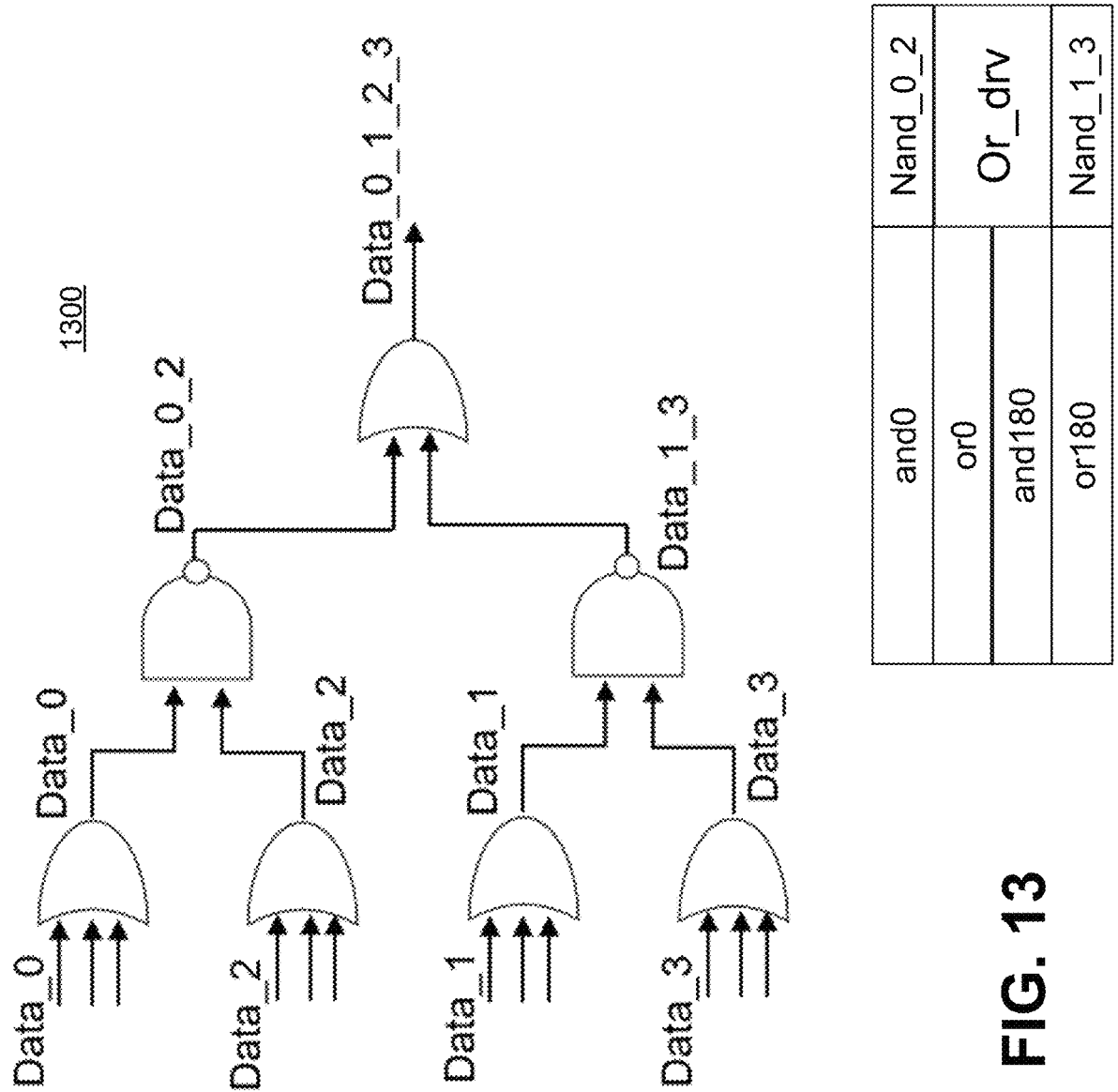
FIG. 13 illustrates a pre-driver circuit 1300 for the shiftless SST TX driver circuit in accordance with some embodiments of the present disclosure.

FIG. 13 illustrates a pre-driver circuit 1300 for the shiftless SST TX driver circuit 400A. The pre-driver circuit 1300 includes a 4:2 multiplexer and a 2:1 multiplexer. The 4:2 multiplexer receives four data signals, denoted as Data_0, Data_2, Data_1, Data_3 as input to output two data signals, denoted as Data_0_2 and Data_1_3. The 2:1 multiplexer receives Data_0_2 and Data_1_3 as input to output Data_0_1_2_3.

Notably, the pre-driver circuit 1300 is much simpler than the pre-driver circuit 1200. The simplified pre-driver circuit 1300 not only reduces layout area, but also reduces power consumption, reduces half of load for clock buffer, and reduces half of load for data buffer. The full rate design eliminate sigma-n noise at low data rate.

FIG. 14 illustrates performance comparisons between the SST TX driver 200 and the shiftless SST TX driver circuit. Notably, in every parameter, such as (but not limited to) corner, input data buffer current, pre-driver current, clock buffer current, gain loss for 1UI impulse, signal to noise distortion ratio (SNDR), random jitter, deterministic jitter (DJ), and even odd jitter (EOJ), the shiftless SST TX driver outperforms the SST TX driver.

Figure 15A:
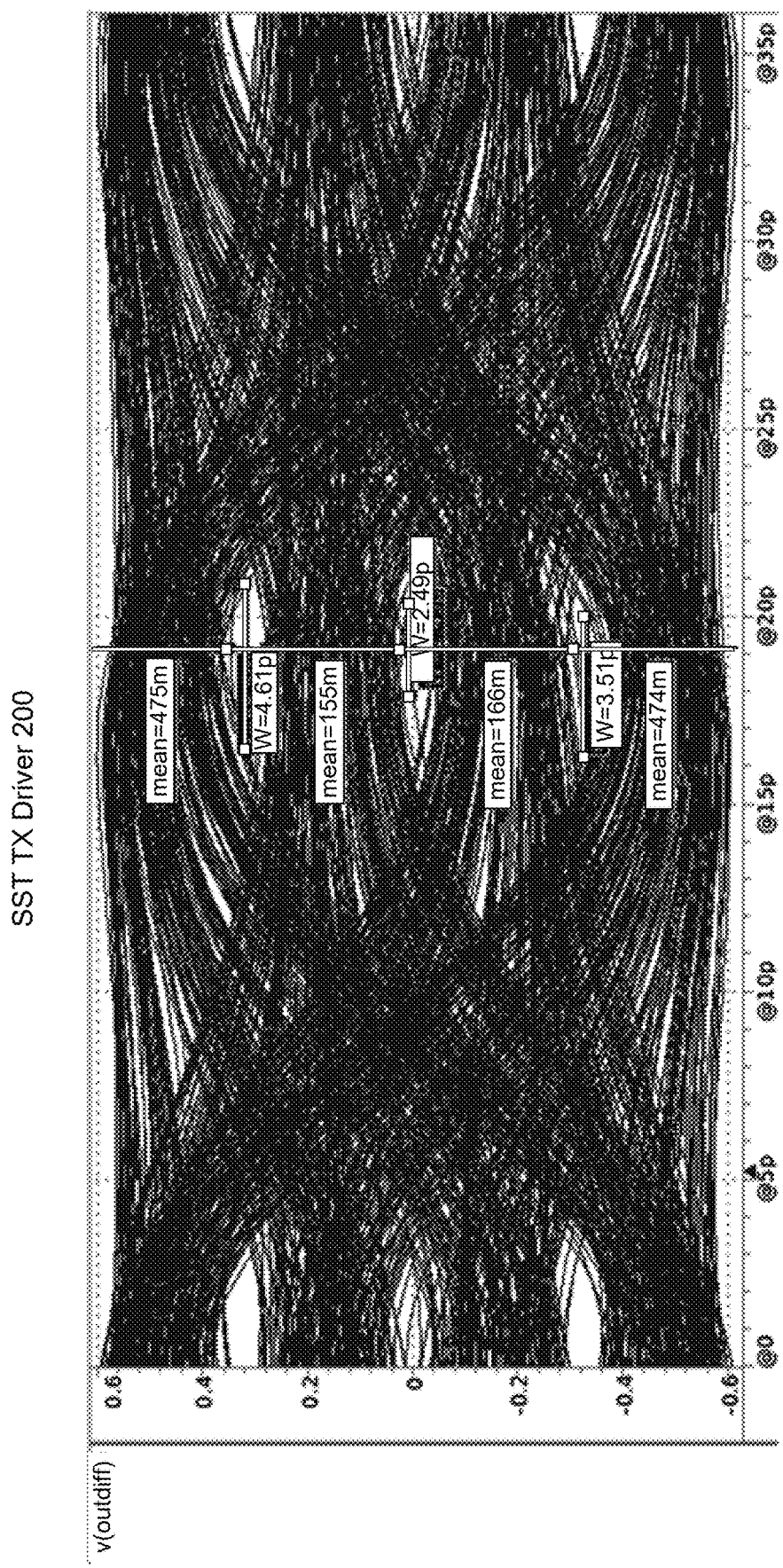
FIGS. 15A-15B illustrate eye diagrams of a SST TX driver circuit and a shiftless SST TX driver circuit in accordance with some embodiments of the present disclosure.
Figure 15B:
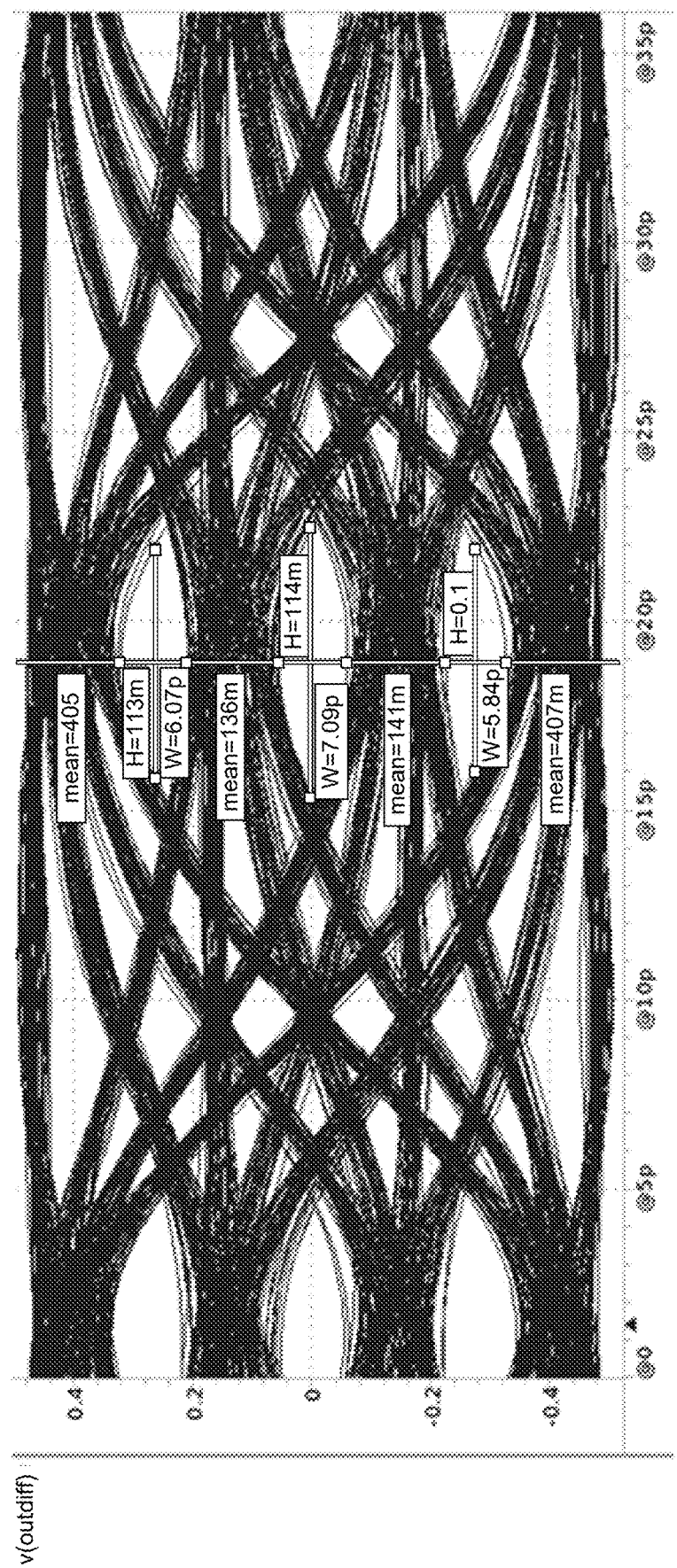

FIGS. 15A-15B illustrate eye diagram comparison of the SST TX driver circuit 200 and the shiftless SST TX driver circuit. An eye diagram is used in electrical engineering to get an idea of signal quality in the digital domain. Generally, the greater the eye opening, the better performance it corresponds. The eye diagram corresponding to the shiftless SST TX driver circuit has much greater eye openings, i.e., the lines are more concentrated, proving that the signal quality of the shiftless SST TX driver circuit 400A is much better than the SST TX driver circuit 200.

The shiftless SST TX driver circuit 400A described herein may be a part of an integrated circuit. The design of such an integrated circuit may be performed or simulated via a computer system.

Figure 16:
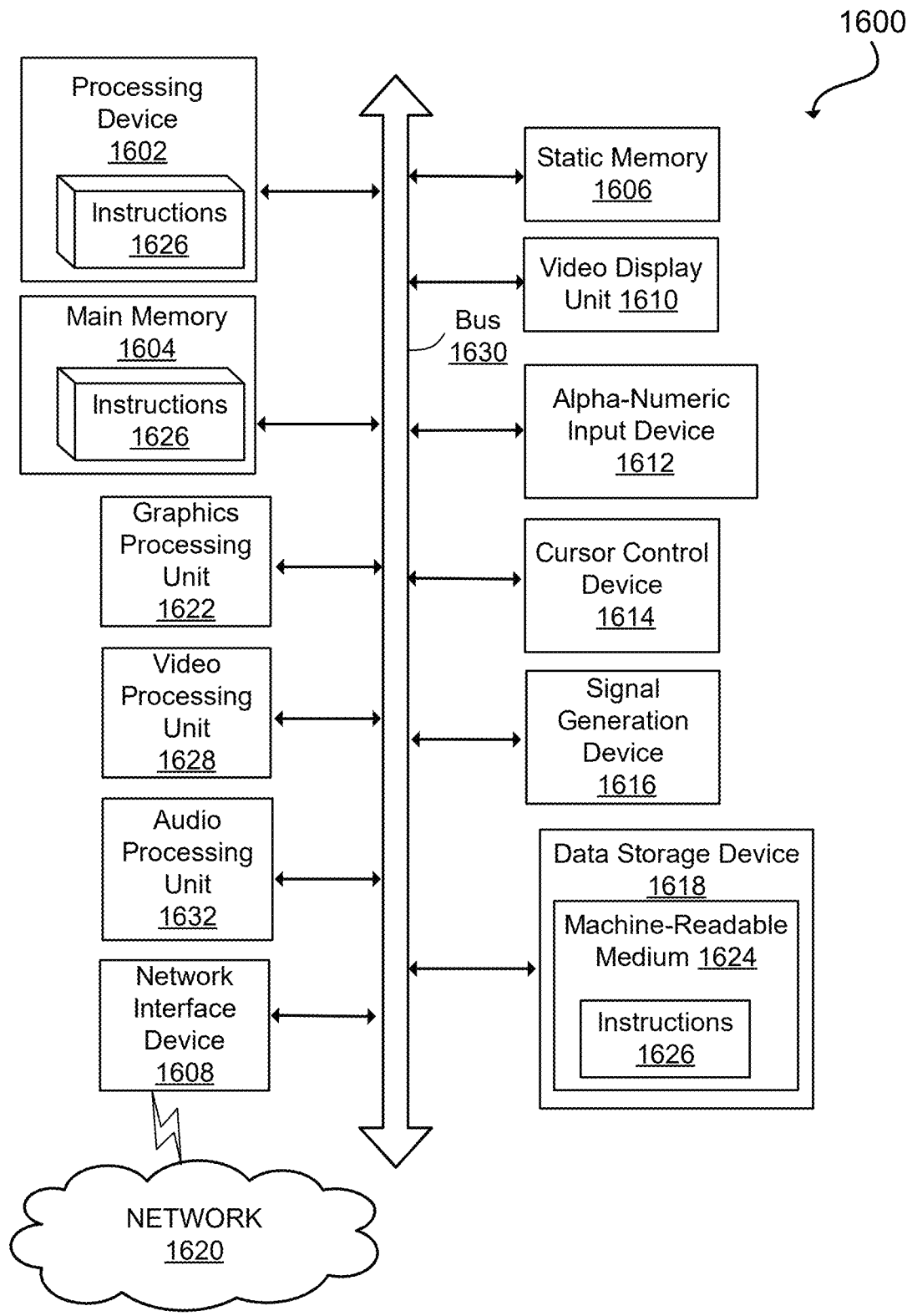
FIG. 16 depicts a diagram of an example computer system in which embodiments of the present disclosure may operate.

The above-described circuits may also be simulated by a computer system. FIG. 16 illustrates an example machine of a computer system 1600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1600 includes a processing device 1602, a main memory 1604 (e.g., read-only memory (ROM), flash memory, dynamic random access memory (DRAM) such as synchronous DRAM (SDRAM), a static memory 1606 (e.g., flash memory, static random access memory (SRAM), etc.), and a data storage device 1618, which communicate with each other via a bus 1630.

Processing device 1602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1602 may also be one or more special-purpose processing devices such as an application specific integrated circuit (ASIC), a field programmable gate array (FPGA), a digital signal processor (DSP), network processor, or the like. The processing device 1602 may be configured to execute instructions 1626 for performing the operations and steps described herein.

The computer system 1600 may further include a network interface device 1608 to communicate over the network 1620. The computer system 1600 also may include a video display unit 1610 (e.g., a liquid crystal display (LCD) or a cathode ray tube (CRT)), an alphanumeric input device 1612 (e.g., a keyboard), a cursor control device 1614 (e.g., a mouse), a graphics processing unit 1622, a signal generation device 1616 (e.g., a speaker), graphics processing unit 1622, video processing unit 1628, and audio processing unit 1632.

The data storage device 1618 may include a machine-readable storage medium 1624 (also known as a non-transitory computer-readable medium) on which is stored one or more sets of instructions 1626 or software embodying any one or more of the methodologies or functions described herein. The instructions 1626 may also reside, completely or at least partially, within the main memory 1604 and/or within the processing device 1602 during execution thereof by the computer system 1600, the main memory 1604 and the processing device 1602 also constituting machine-readable storage media.

In some implementations, the instructions 1626 include instructions to implement functionality corresponding to the present disclosure. While the machine-readable storage medium 1624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A transmitter driver circuit, comprising:
   a first PMOS device having a gate, a source, and a drain;
   a second PMOS device having a gate, a source, and a drain, wherein the source of the second PMOS device is electrically coupled with the source of the first PMOS device;
   a first NMOS device having a gate, a source, and a drain;
   a second NMOS device having a gate, a source, and a drain, wherein the gate of the first PMOS device is electrically coupled with the gate of the first NMOS device, and the gate of the second PMOS device is electrically coupled with the gate of the second NMOS device, and
   a sub-circuit electrically coupled with a voltage domain and the sources of the first and second PMOS devices to provide a voltage lower than the voltage domain to the sources of the first and second PMOS devices, wherein the sub-circuit comprises:
   (i) a third PMOS device having a gate, a drain, and a source, wherein the source is electrically coupled with the voltage domain, and the gate is configured to receive a control signal to turn on or off current flow through the source and the drain of the third PMOS device, and a third resistor electrically coupled with the drain of the third PMOS device and the sources of the first and second PMOS devices; or
   (ii) a programmable diode array circuit comprising a plurality of programmable diodes in parallel, wherein each of the plurality of programmable diodes is configured to receive a control signal to control impedance of the programmable diode, which in turn controls the voltage provided to the sources of the first and second PMOS devices.

2. The transmitter driver circuit of claim 1, further comprising:
   a first resistor electrically coupled with the drain of the first PMOS device and the source of the first NMOS device,
   a second resistor electrically coupled with the drain of the second PMOS device and the source of the second NMOS device;
   a first differential output pad electrically coupled with the drain of the first PMOS device, and
   a second differential output pad electrically coupled with the drain of the second PMOS device.

3. The transmitter driver circuit of claim 1, further comprising:
   a first resistor;
   a second resistor, wherein the first resistor is electrically coupled with the drain of the first PMOS device and the second resistor, and the second resistor is electrically coupled with the first resistor and the source of the first NMOS device;
   a third resistor;
   a fourth resistor, wherein the third resistor is electrically coupled with the drain of the second PMOS device and the fourth resistor, and the fourth resistor is electrically coupled with the third resistor and the source of the second NMOS device;
   a first differential output pad electrically coupled with the first resistor and the second resistor, and
   a second differential output pad electrically coupled with the third resistor and the fourth resistor.

4. The transmitter driver circuit of claim 1, further comprising:
   a first resistor;
   a second resistor, wherein the first resistor is electrically coupled with the drain of the first PMOS device and the second resistor;
   a third resistor;
   a fourth resistor, wherein the third resistor is electrically coupled with the drain of the second PMOS device and the fourth resistor;
   a first differential output pad electrically coupled with the second resistor, and
   a second differential output pad electrically coupled with the fourth resistor.

5. The transmitter driver circuit of claim 1, the programmable diode array circuit further comprising:
   a plurality of third PMOS devices, each of which has a gate, a source, and a drain, wherein each of the plurality of programmable diode is electrically coupled with the gate and the drain of one of the plurality of third PMOS devices.

6. The transmitter driver circuit of claim 5, the programmable diode array circuit further comprising:
   a third resistor electrically coupled with the drains of the plurality of third PMOS devices, and the sources of the first and second PMOS devices.

7. The transmitter driver circuit of claim 1, wherein the drain of the first NMOS device is electrically coupled with the drain of the second NMOS device.

8. The transmitter driver circuit of claim 1, further comprising a pre-driver circuit, the pre-driver circuit comprising:

a 4:2 multiplexer configured to receive a 4-bit data signal as input and serialize the 4-bit data signal to a 2-bit data signal; and a 2:1 multiplexer configured to receive the 2-bit data signal as input and serialize the 2-bit data signal to a first 1-bit data signal and a second 1-bit data signal that is in inverse phase respect to the first 1-bit data signal, wherein the first 1-bit data signal is the first data signal, and the second 1-bit data signal is the second data signal that input to the transmitter driver circuit.

9. A transmitter driver comprising:

a pre-driver circuit configured to serialize multi-bit data into 1-bit data; and a driver circuit configured to receive the 1-bit data from the pre-driver and transmit the 1-bit data, wherein the driver circuit comprises:
- a first PMOS device having a gate, a source, and a drain;
- a second PMOS device having a gate, a source, and a drain, wherein the source of the second PMOS device is electrically coupled with the source of the first PMOS device;
- a first NMOS device having a gate, a source, and a drain;
- a second NMOS device having a gate, a source, and a drain, wherein the gate of the first PMOS device is electrically coupled with the gate of the first NMOS device, and the gate of the second PMOS device is electrically coupled with the gate of the second NMOS device, and
- a sub-circuit electrically coupled with a voltage domain and the sources of the first and second PMOS devices to provide a voltage lower than the voltage domain to the sources of the first and second PMOS devices, wherein the sub-circuit comprises:
  - (i) a third PMOS device having a gate, a drain, and a source, wherein the source is electrically coupled with the voltage domain, and the gate is configured to receive a control signal to turn on or off current flow through the source and the drain of the third PMOS device, and a third resistor electrically coupled with the drain of the third PMOS device and the sources of the first and second PMOS devices; or
  - (ii) a programmable diode array circuit comprising a plurality of programmable diodes in parallel, wherein each of the plurality of programmable diodes is configured to receive a control signal to control impedance of the programmable diode, which in turn controls the voltage provided to the sources of the first and second PMOS devices.

10. The transmitter driver of claim 9, the driver circuit further comprising:

a first resistor electrically coupled with the drain of the first PMOS device and the source of the first NMOS device, a second electrically coupled with the drain of the second PMOS device and the source of the second NMOS device;

a first differential output pad electrically coupled with the drain of the first PMOS device, and a second differential output pad electrically coupled with the drain of the second PMOS device.

11. The transmitter driver of claim 9, the driver circuit further comprising:

a first resistor;

a second resistor, wherein the first resistor is electrically coupled with the drain of the first PMOS device and the second resistor, and the second resistor is electrically coupled with the first resistor and the source of the first NMOS device;

a third resistor;

a fourth resistor, wherein the third resistor is electrically coupled with the drain of the second PMOS device and the fourth resistor, and the fourth resistor is electrically coupled with the third resistor and the source of the second NMOS device;

a first differential output pad electrically coupled with the first resistor and the second resistor, and a second differential output pad electrically coupled with the third resistor and the fourth resistor.

12. The transmitter driver of claim 9, the driver circuit further comprising:

a first resistor;

a second resistor, wherein the first resistor is electrically coupled with the drain of the first PMOS device and the second resistor;

a third resistor;

a fourth resistor, wherein the third resistor is electrically coupled with the drain of the second PMOS device and the fourth resistor;

a first differential output pad electrically coupled with the second resistor, and a second differential output pad electrically coupled with the fourth resistor.

13. The transmitter driver of claim 9, the programmable diode array circuit further comprising:

a plurality of third PMOS devices, each of which has a gate, a source, and a drain, wherein each of the plurality of programmable diode is electrically coupled with the gate and the drain of one of the plurality of third PMOS devices.

14. The transmitter driver of claim 13, the programmable diode array circuit further comprising:

a third resistor electrically coupled with the drains of the plurality of third PMOS devices, and the sources of the first and second PMOS devices.

15. The transmitter driver of claim 9, the pre-driver circuit comprising:

a 4:2 multiplexer configured to receive a 4-bit data signal as input and serialize the 4-bit data signal to a 2-bit data signal; and a 2:1 multiplexer configured to receive the 2-bit data signal as input and serialize the 2-bit data signal to a first 1-bit data signal and a second 1-bit data signal that is in inverse phase respect to the first 1-bit data signal, wherein the first 1-bit data signal is the first data signal, and the second 1-bit data signal is the second data signal that input to the transmitter driver circuit.

16. A non-transitory computer readable medium comprising stored instructions, which when executed by a processor, cause the processor to simulate a transmitter driver circuit, wherein the transmitter driver circuit comprises:

a first PMOS device having a gate, a source, and a drain;

a second PMOS device having a gate, a source, and a drain, wherein the source of the second PMOS device is electrically coupled with the source of the first PMOS device;

a first NMOS device having a gate, a source, and a drain;

a second NMOS device having a gate, a source, and a drain, wherein the gate of the first PMOS device is electrically coupled with the gate of the first NMOS device, and the gate of the second PMOS device is electrically coupled with the gate of the second NMOS device, and a sub-circuit electrically coupled with a voltage domain and the sources of the first and second PMOS devices to provide a voltage lower than the voltage domain to the sources of the first and second PMOS devices, wherein the sub-circuit comprises:
  (i) a third PMOS device having a gate, a drain, and a source, wherein the source is electrically coupled with the voltage domain, and the gate is configured to receive a control signal to turn on or off current flow through the source and the drain of the third PMOS device, and a third resistor electrically coupled with the drain of the third PMOS device and the sources of the first and second PMOS devices; or
  (ii) a programmable diode array circuit comprising a plurality of programmable diodes in parallel, wherein each of the plurality of programmable diodes is configured to receive a control signal to control impedance of the programmable diode, which in turn controls the voltage provided to the sources of the first and second PMOS devices.

17. A non-transitory computer readable medium of claim 16, wherein the transmitter driver circuit comprises:
  a first resistor electrically coupled with the drain of the first PMOS device and the source of the first NMOS device,
  a second resistor electrically coupled with the drain of the second PMOS device and the source of the second NMOS device;
  a first differential output pad electrically coupled with the drain of the first PMOS device, and
  a second differential output pad electrically coupled with the drain of the second PMOS device.

18. A non-transitory computer readable medium of claim 16, wherein the transmitter driver circuit comprises:
  a first resistor;
  a second resistor, wherein the first resistor is electrically coupled with the drain of the first PMOS device and the second resistor, and the second resistor is electrically coupled with the first resistor and the source of the first NMOS device;
  a third resistor;
  a fourth resistor, wherein the third resistor is electrically coupled with the drain of the second PMOS device and the fourth resistor, and the fourth resistor is electrically coupled with the third resistor and the source of the second NMOS device;
  a first differential output pad electrically coupled with the first resistor and the second resistor, and
  a second differential output pad electrically coupled with the third resistor and the fourth resistor.

19. The non-transitory computer readable medium of claim 16, wherein the transmitter driver circuit comprises:
  a first resistor;
  a second resistor, wherein the first resistor is electrically coupled with the drain of the first PMOS device and the second resistor;
  a third resistor;
  a fourth resistor, wherein the third resistor is electrically coupled with the drain of the second PMOS device and the fourth resistor;
  a first differential output pad electrically coupled with the second resistor, and
  a second differential output pad electrically coupled with the fourth resistor.

20. The non-transitory computer readable medium of claim 16, the programmable diode array circuit further comprising:
  a plurality of third PMOS devices, each of which has a gate, a source, and a drain, wherein each of the plurality of programmable diode is electrically coupled with the gate and the drain of one of the plurality of third PMOS devices.

* * * * *